US009197215B1

(12) United States Patent
Balandin et al.

(10) Patent No.: US 9,197,215 B1
(45) Date of Patent: Nov. 24, 2015

(54) GRAPHENE-BASED NON-BOOLEAN LOGIC CIRCUITS

(71) Applicant: The Regents of the University of California, Oakland, CA (US)

(72) Inventors: Alexander A. Balandin, Riverside, CA (US); Alexander Khitun, Long Beach, CA (US); Roger Lake, Riverside, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 14/268,765

(22) Filed: May 2, 2014

(51) Int. Cl.
| | |
|---|---|
| *H01L 29/06* | (2006.01) |
| *H03K 19/08* | (2006.01) |
| *H01L 47/00* | (2006.01) |
| *H01L 29/16* | (2006.01) |
| *H01L 29/786* | (2006.01) |
| *H03K 19/20* | (2006.01) |
| *B82Y 99/00* | (2011.01) |

(52) U.S. Cl.
CPC ............ *H03K 19/08* (2013.01); *H01L 29/1606* (2013.01); *H01L 29/78648* (2013.01); *H01L 29/78684* (2013.01); *H01L 47/00* (2013.01); *H03K 19/20* (2013.01); *B82Y 99/00* (2013.01); *Y10S 977/936* (2013.01)

(58) Field of Classification Search
CPC . H01L 29/1606; H01L 29/775; H01L 27/283; H01L 51/0554; H01L 51/0558; H01L 51/0045; H01L 29/78648; H01L 47/00; H03K 19/08
USPC ........................................................ 257/29
See application file for complete search history.

(56) References Cited

U.S. PATENT DOCUMENTS

| | | | |
|---|---|---|---|
| 2012/0115295 A1* | 5/2012 | Lin et al. ......................... | 438/268 |
| 2013/0048948 A1* | 2/2013 | Heo et al. ......................... | 257/27 |
| 2013/0234762 A1* | 9/2013 | Han et al. ......................... | 327/109 |

OTHER PUBLICATIONS

Author Unknown, "International Technology Roadmap for Semiconductors: 2012 Update Overview," 2012, 76 pages.
Balandin, A. A., "Thermal properties of graphene and nanostructured carbon materials," Nature Materials, vol. 10, Aug. 2011, pp. 569-581.
Bolotin, K. I. et al., "Ultrahigh electron mobility in suspended graphene," Solid State Communications, vol. 146, 2008, pp. 351-355.

(Continued)

*Primary Examiner* — Tu-Tu Ho
(74) *Attorney, Agent, or Firm* — Withrow & Terranova, P.L.L.C.

(57) ABSTRACT

A dual-gate transistor having a negative differential resistance (NDR) region is disclosed. The dual-gate transistor includes a back-gate, a zero-bandgap graphene layer disposed on the back-gate, a top-gate disposed on a portion of the zero-bandgap graphene layer adjacent to the top-gate, and a drain disposed on a portion of the zero-bandgap graphene layer adjacent to the top-gate and displaced from the source. Also included is a dynamic bias controller configured to simultaneously sweep a source-drain voltage and a top-gate voltage across a Dirac point to provide operation within the NDR region. Operation within the NDR region is employed to realize non-Boolean logic functions. Graphene-based non-Boolean logic circuits are constructed from pluralities of the disclosed dual-gate transistor. Pattern recognition circuitry for operation between 100 GHz and 500 GHz is also disclosed via the graphene-based non-Boolean logic circuits.

20 Claims, 26 Drawing Sheets

(56) References Cited

OTHER PUBLICATIONS

Bourianoff, G. et al., "Boolean Logic and Alternative Information-Processing Devices," Computer, vol. 41, No. 5, May 2008, pp. 38-46.

Calizo, I. et al., "The effect of substrates on the Raman spectrum of graphene: Graohene-on-sapphire and graphene-on-glass," Applied Physics Letters, vol. 91, Nov. 13, 2007, pp. 201904-1 to 201904-3.

Calizo, I. et al., "Variable temperature Raman microscopy as a nanometrology tool for graphene layers and graphene-based devices," Applied Physics Letters, vol. 91, Aug. 15, 2007, pp. 071913-1-071913-3.

Cheng, R. et al., "High-frequency self-aligned graphene transistors with transferred gate stacks," PNAS, vol. 109, No. 29, Jul. 17, 2012, pp. 11588-11592.

Cho, Y. H. et al., "Deep Network Packet Filter Design for Reconfigurable Devices," ACM Transactions on Embedded Computing Systems, vol. 7, No. 2, Article 21, Feb. 2008, pp. 21:1-26.

Choi, S. M. et al., "Controlling Energy Gap of Bilayer Graphene by Strain," Nano Letters, vol. 10, Aug. 2, 2010, pp. 3486-3489.

Chua, L. O. et al., "Cellular Neural Networks: Theory," IEEE Transactions on Circuits and Systems, vol. 35, No. 10, Oct. 1988, pp. 1257-1272.

Dean, C. R. et al., "Boron nitride substrates for high-quality graphene electronics," Nature Nanotechnology, vol. 5, Oct. 2010, pp. 722-726.

Fiori, G., "Negative Differential Resistance in Mono and Bilayer Graphene p-n. Junctions," IEEE Electron Device Letters, vol. 32, No. 10, Oct. 2011, pp. 1334-1336.

Grassi, R. et al., "Contact-induced negative differential resistance in short-channel graphene FETs," IEEE Electron Device Letters, vol. 60, No. 1, Dec. 2012, pp. 140-146.

Han, M. et al., "Energy Band-Gap Engineering of Graphene Nanoribbons," Physical Review Letters, vol. 98, May 16, 2007, pp. 206805-1 to 206805-4.

Jaeger, Richard C., et al., "Microelectronic Circuit Design," McGraw Hill, Fourth Edition, 1997.

Kienle, D. et al., "Extended Hückel theory for band structure, chemistry, and transport. I. Carbon nanotubes," Journal of Applied Physics, vol. 100, Aug. 29, 2006, pp. 043714-1 to 043714-9.

Kim, S. et al., "Realization of a high mobility dual-gated graphene field-effect transistor with AL2O3 dielectric," Applied Physics Letters vol. 94, Feb. 12, 2009, pp. 062107-1 to 062107-3.

Lin, Y.-M. et al., "Operation of Graphene Transistors at Gigahertz Frequencies," Nano Letters, vol. 9, No. 1, 2009, pp. 422-426.

Liu, G. et al., "Low-frequency electronic noise in the double-gate single-layer graphene transistors," Applied Physics Letters, vol. 95, 2009, pp. 033103-1 to 033103-3.

Liu, G. et al., "Exitaxial Graphene Nanoribbon Array Fabrication Using BCP-Assisted Nanolithography," ACS Nano, vol. 6, No. 8, Jul. 10, 2012, pp. 6786-6792.

Mulliken, R. S. et al., "Formulas and Numerical Tables for Overlap Integrals," The Journal of Chemical Physics, vol. 17 No. 12, Dec. 1949, pp. 1248-1267.

Neumann, J., "Theory of Self-Reproducing Automata," University of Illinois Press, 1966, pp. 64-87.

Nguyen, V. H. et al., "Gate-controllable negative differential conductance in graphene tunneling transistors," Semiconductor Science and Technology, vol. 27, 2012, pp. 105018-105024.

Ni, Z. H. et al., "Uniaxial Strain on Graphene: Raman Spectroscopy Study and Band-Gap Opening," ACS Nano, vol. 2 No. 11, Oct. 30, 2008, pp. 2301-2305.

Novoselov, K. S. et al., "Electric Field Effect in Atomically Thin Carbon Films," Science, vol. 306, Oct. 22, 2004, pp. 666-669.

Rahman, A. et al., "Theory of Ballistic Nanotransistors," IEEE Transactions on Electron Devices, vol. 50, No. 9, Sep. 2003, pp. 1853-1864.

Raza, H. et al., "An Extended Hückel Theory based Atomistic Model for Graphene Nanoelectronics," Journal of Computational Electronics, vol. 7, No. 3, 2008, pp. 372-375.

Schwierz, F., "Graphene transistors," Nature Nanotechnology, vol. 5, Jul. 2010, pp. 487-496.

Song, Y. et al., "Negative differential resistances in graphene double barrier resonant tunneling diodes," Applied Physics Letters, vol. 102, Mar. 8, 2013, pp. 093118-1 to 093118-5.

Strukov, D., "Hybrid CMOS/Nanodevice Circuits with Tightly Integrated Memory and Logic Functionality," Proceedings of Nanotech, vol. 2, Jun. 2011, pp. 9-12.

Szafranek, B. N. et al., "High On/Off Ratios in Bilayer Graphene Field Effect Transistors Realized by Surface Dopants," Nano Letters, vol. 11, Jun. 20, 2011, pp. 2640-2643.

Wu, Y. et al., "Three-Terminal Graphene Negative Differential Resistance Devices," ACS Nano, vol. 6, No. 3, Feb. 10, 2012, pp. 2610-2616.

Xia, F. et al., "Graphene Field-Effect Transistors with High On/Off Current Radio and Large Transport Band Gap at Room Temperature," Nano Letters, vol. 10, pp. 715-718 (2010).

Yang, X. et al., "Triple-Mode Single-Transistor Graphene Amplifier and Its Applications," ACS Nano, vol. 4, No. 10, Oct. 12, 2010, pp. 5532-5538.

Zhang, W. et al., "Opening an Electrical Band Gap of Bilayer Graphene with Molecular Doping," ACS Nano, vol. 5 No. 9, Aug. 2011, pp. 7517-7524.

Zhang, Y. et al., "Direct observation of a widely tunable bandgap in bilayer graphene," Nature, vol. 459, Jun. 11, 2009, pp. 820-823.

Zhirnov, V. V. et al., "An Energy Barrier Framework for the Limits of Charge- and Spin-Based Switches," Journal of Nanoelectronics and Optoelectronics, vol. 1, Issue 1, Feb. 2006, pp. 52-59.

\* cited by examiner

GRAPHENE-BASED NON-BOOLEAN LOGIC CIRCUITS

GOVERNMENT SUPPORT

This invention was made with Government support under HR001-13-3-0002, awarded by the United States Department of Defense, Defense Advanced Research Projects Agency. The Government has certain rights in the invention.

FIELD OF THE DISCLOSURE

The present disclosure relates to graphene transistors and graphene-based logic circuitry for non-Boolean computational architectures.

BACKGROUND

Modern digital logic is based on Boolean algebra implemented in semiconductor switch-based circuits. For more than a half-century, downscaling of silicon complementary-metal-oxide-semiconductor technology (CMOS) provided increasing performance of computer chips and enabled progress in information technologies. However, even as electronic industry leaders are presently working with sub 10-nm silicon technology, it is widely expected that a downscaling of silicon CMOS technology will not last much further beyond 2026. A problem of heat dissipation and the physical limitations of silicon are expected to end the "era of silicon" computer chips that have enabled progress in information technologies. This fact motivates a search for alternative materials and computational paradigms that can, if not replace silicon CMOS, then at least complement silicon CMOS in special-task information processing.

Graphene is a material that is presently being investigated as a possible alternative to silicon. Since the first mechanical exfoliation of graphene and discovery of its extraordinary high electron mobility at room temperature (RT), graphene has attracted attention as a potential candidate for future electronics. In addition to its high electron mobility, graphene reveals exceptional heat conduction properties, high saturation velocity, convenient planar geometry and compatibility for integration with commonly used integrated circuit substrates. However, an absence of an energy bandgap, $E_G$, in graphene means that graphene devices cannot be switched off. As a result, high leakage currents and prohibitive energy dissipation occur during the operation of graphene devices. A large number of research groups have attempted to solve this problem of a lack of bandgap via application of an electric field, quantum confinement of carriers in nanometer-scale ribbons, surface functionalization with various atoms and strain engineering. Included in the outcomes of these efforts has been a modest bandgap opening of only a few hundred meV that comes at the expense of strongly degraded electron mobility. Traditional applications of graphene in digital circuits require a bandgap on the order of 1 eV at room temperature (RT), which requires a thousand-fold increase in the best bandgap results seen to date. As a result, progress in increasing graphene's meager bandgap is probably decades away if possible at all. Thus, what is needed is a new graphene transistor structure and logic circuitry that does not rely on a bandgap for operation.

SUMMARY

A dual-gate transistor having a negative differential resistance (NDR) region is disclosed. The dual-gate transistor includes a back-gate, a zero-bandgap graphene layer disposed on the back-gate, a top-gate disposed on a portion of the zero-bandgap graphene layer adjacent to the top-gate, and a drain disposed on a portion of the zero-bandgap graphene layer adjacent to the top-gate and displaced from a source. Also included is a dynamic bias controller configured to simultaneously sweep a source-drain voltage and a top-gate voltage across a Dirac point to provide operation within the NDR region. Operation within the NDR region is employed to realize non-Boolean logic functions. Graphene-based non-Boolean logic circuits are constructed from pluralities of the disclosed dual-gate transistor. Pattern recognition circuitry for operation between 100 GHz and 500 GHz is also disclosed via the graphene-based non-Boolean logic circuits.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

Figure 1A:
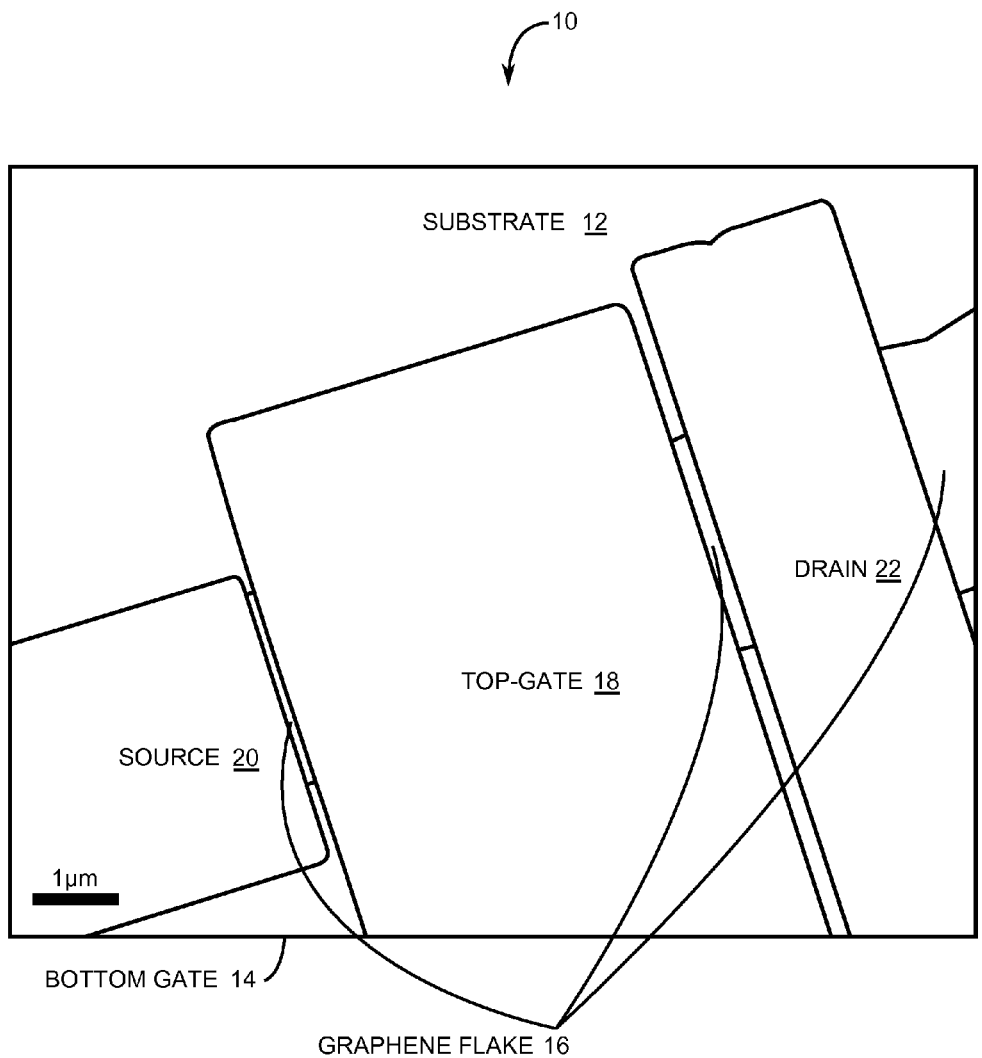
FIG. 1A is a top view of an outline drawing of a scanning electron microscope image of a graphene-based dual-gate transistor having a negative differential resistance region (NDR) in accordance with the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on", "disposed on" or extending "onto" another element, it can be directly on, disposed directly on or extend directly onto the other element or intervening elements may also be present. In contrast, when an element is referred to as being "directly on", "directly disposed on", or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Graphene research has revealed a number of unique properties that are beneficial for advances within the electronics industry. However, as discussed in the background provided above, graphene does not have an energy bandgap, presenting a serious hurdle for graphene's implementation in digital logic gates. Efforts to induce an energy bandgap in graphene via quantum confinement or surface functionalization have not resulted in a breakthrough. The present disclosure reveals that a negative differential resistance (NDR) experimentally observed in graphene field-effect transistors (FETs) allows for construction of viable non-Boolean logic computational architectures implemented with zero-bandgap graphene. Moreover, the disclosed graphene FET structure is fabricated using pristine single layer and bilayer graphene to preserve graphene's inherent physical properties of high electron mobility, exceptional heat conduction properties, high saturation velocity, convenient planar geometry and compatibility for integration with commonly used integrated circuit substrates. Further still, the NDR observed under certain biasing schemes is an intrinsic property of graphene resulting from its symmetric band structure. Atomistic modeling shows that the NDR appears not only in a drift-diffusion regime but also in a ballistic regime at the nanometer scale. Experimental results depicted herein disclose a paradigm shift in graphene research and illustrate an alternative route for graphene applications in electronic digital information processing.

The present disclosure provides a departure from conventional approaches associated with the use of graphene in electronic applications. Any attempts to provide graphene with semiconductor properties necessary to implement silicon CMOS architectures by artificially inducing an energy bandgap are avoided. In order to simplify device structures and technological steps, the present disclosure does not rely on tunneling effects in any disclosed device design. Moreover, the present disclosure does not use high electrical fields to induce non-uniform doping to activate the NDR. Instead, through first-principle atomistic modeling, it is disclosed that the NDR effect holds true in a ballistic transport regime, which is a necessary characteristic for downscaled architectures operating in a sub-micron or nanoscale environment. The alternative computational paradigm disclosed herein makes use of the NDR effect and can be effectively implemented with graphene that is pristine and does not include an induced energy bandgap. Instead, the disclosed graphene-based logic circuitry relies on the NDR effect intrinsic to graphene and benefits from graphene's high electron mobility and thermal conductivity.

The present disclosure provides experimentally found conditions for both observing the NDR effect in dual-gate graphene field-effect transistors (G-FETs) and the means of controlling the strength of the NDR effect. Exemplary embodiments of the disclosed dual-gate G-FETs are fabricated from mechanically exfoliated graphene on a semiconductor substrate, such as Si/SiO$_2$. However, it is to be understood that the present disclosure is not limited to exfoliated graphene. Graphene fabricated onto substrates via Chemical Vapor Deposition (CVD) and other known and developing graphene synthesis techniques are usable and preferred for realizing commercial applications of the disclosed structures and techniques.

In an exemplary embodiment, the semiconductor substrate is a relatively heavily doped Si substrate. Micro-Raman spectroscopy is used to select samples of single layer graphene (SLG) and bilayer graphene (BLG). Source, drain, and gate regions made of Ti and Au are defined by electron-beam lithography (EBL). A top-gate oxide is deposited using a two-layer method. A first layer is a thin film of evaporated Al, which is oxidized in air. A second layer is grown by atomic layer deposition (ALD). The heavily doped Si substrate serves as a back-gate for a dual-gate G-FET.

FIG. 1A shows a typical scanning electron microscopy (SEM) image of a bilayer graphene (BLG) dual-gate G-FET 10. The BLG dual-gate G-FET 10 is fabricated on a substrate 12 that comprises a bottom gate 14. A graphene layer 16 is disposed onto the substrate 12. In this exemplary prototype, the graphene layer 16 is an exfoliated graphene flake. It is to be understood that the graphene layer 16 is preferably a pristine graphene sheet that is grown using a process such as chemical vapor deposition (CVD). A top-gate 18 is disposed onto the graphene layer 16. A source 20 is disposed onto the graphene layer 16 adjacent to and spaced from the top-gate 18. A drain 22 is disposed onto the graphene layer 16 adjacent to and spaced from both the top-gate 18 and the source 20.

Figure 1B:
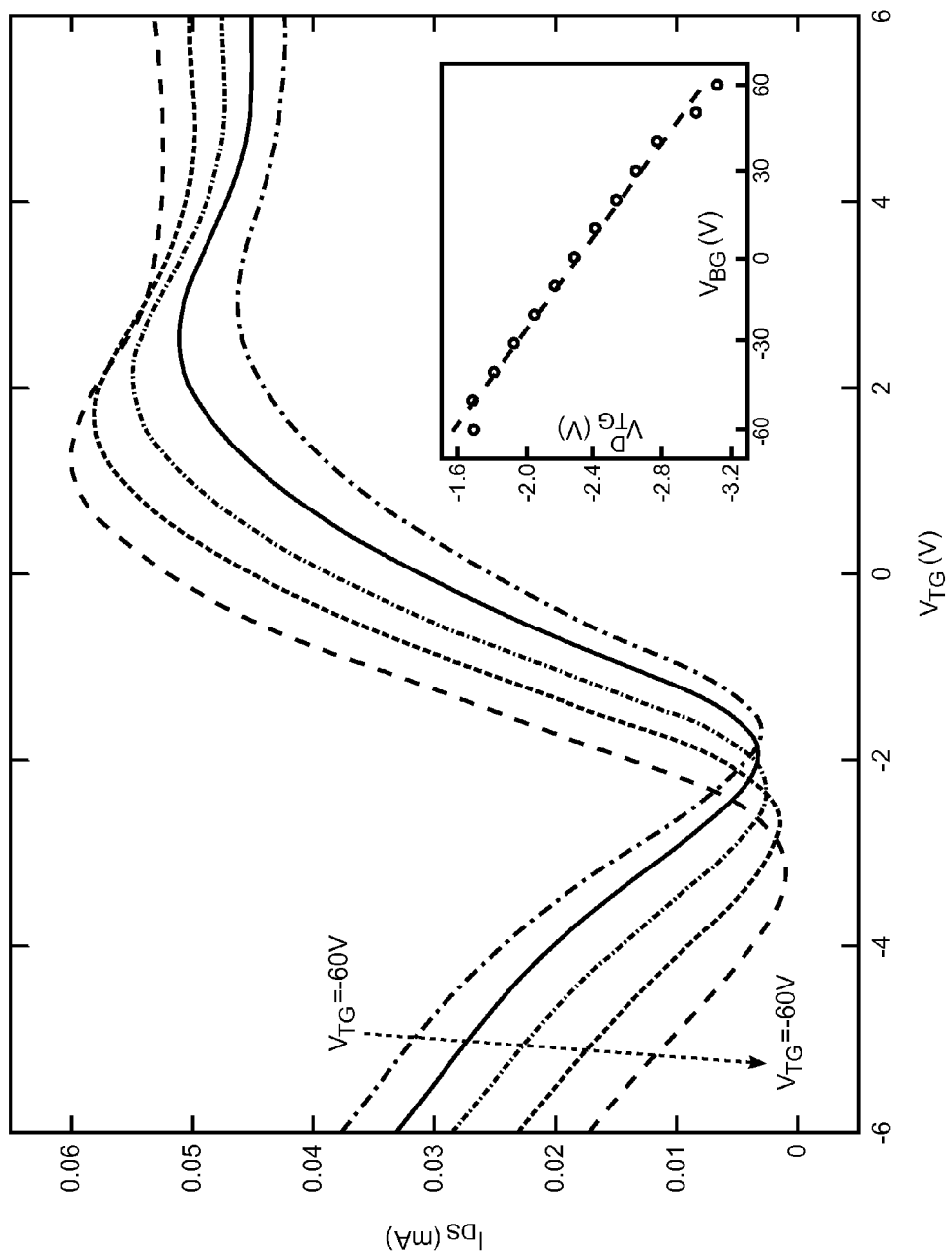
FIG. 1B is a graph depicting transfer characteristics of a bilayer graphene (BLG) transistor under various back-gate voltages.

FIG. 1B is a graph depicting transfer characteristics of the BLG dual-gate G-FET 10 under different back-gate voltages, $V_{BG}$. A decreased Dirac point conductivity at large back-gate voltages $V_{BG}$ indicates a transport gap opening in the BLG dual-gate G-FET 10 by the displacement field. The transport gap induced by back-gate voltages $V_{BG}$ in the BLG dual-gate G-FET 10 is beneficial for the NDR effect but the transport gap does not play a key role. In fact, as discussed below, the mechanism of onset of the NDR effect as provided by this disclosure is the same for single layer graphene (SLG) and bilayer graphene (BLG).

In order to obtain NDR characteristics in dual-gate G-FETs that can be used for logic functions, an unconventional biasing scheme is applied. A conventional bias sets only one terminal with variable input, while all other terminals are fixed at constant values. For example, in a source-drain current $I_{DS}$ versus gate voltage $V_{GS}$ measurement, a source-drain voltage $V_{DS}$ and the back-gate voltage $V_{BG}$ are fixed, while the source-drain current $I_{DS}$ is controlled by sweeping a top-gate voltage $V_{TG}$. Interestingly, the BLG dual-gate G-FET 10 reveals NDR when the source-drain voltage $V_{DS}$ and the top-gate voltage $V_{TG}$ are swept simultaneously. The NDR effect occurs as the source-drain voltage $V_{DS}$ increases from zero while the top-gate voltage $V_{TG}$ scans across a Dirac point where electrons and holes behave as relativistic particles. As a result, a magnitude of a peak-to-valley current ratio, $I_P/I_V$, can be tuned by the back-gate voltage $V_{BG}$.

Figure 1C:
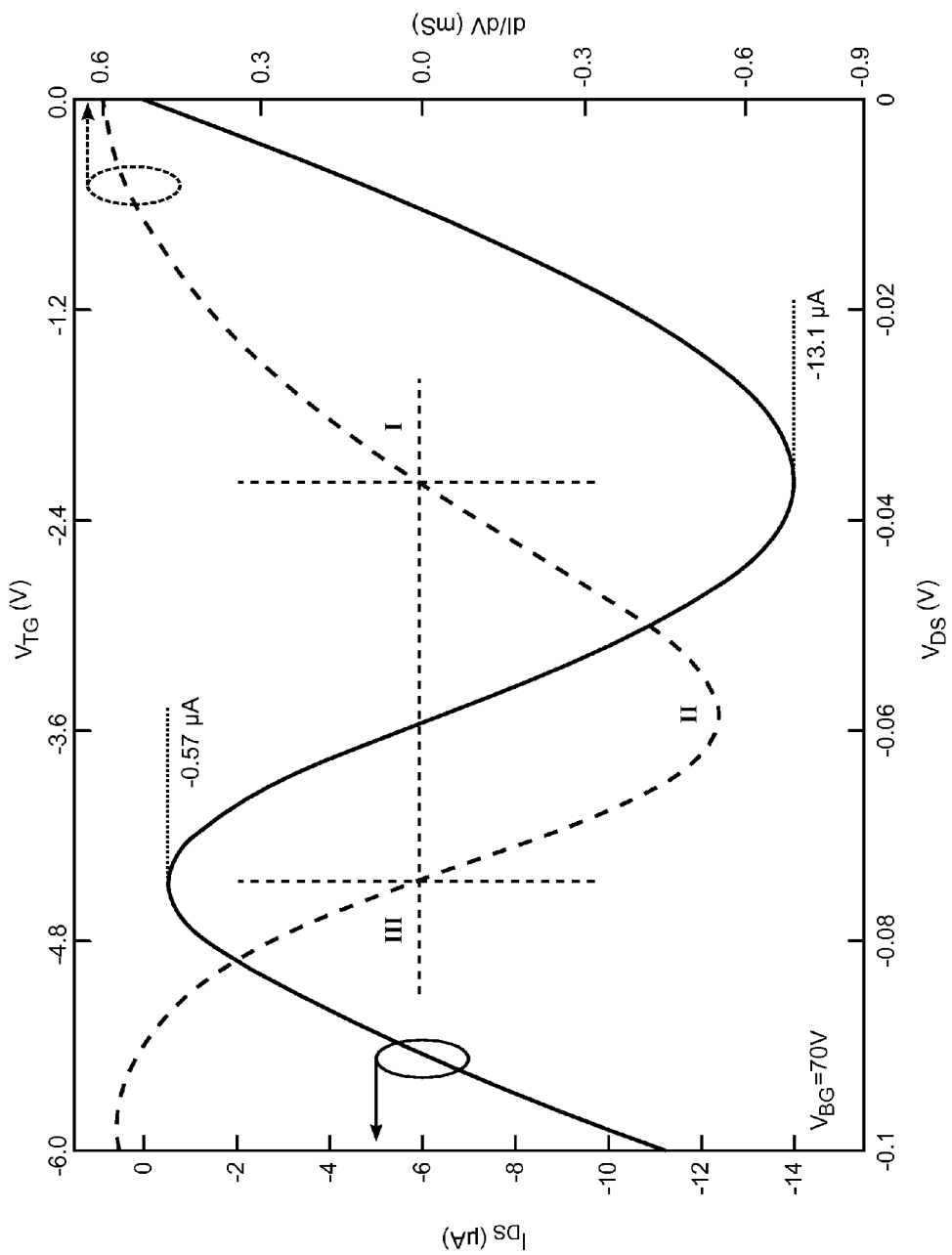
FIG. 1C is a graph depicting an N-shaped NDR for a graphene-based dual-gate transistor wherein source to drain voltage ranges from 0 V to −0.1 V while a top-gate voltage ranges from 0 V to −6 V.

FIG. 1C shows an N-shaped NDR for the BLG dual-gate G-FET 10 with a back-gate voltage $V_{BG}$=70 V while the source-drain voltage $V_{DS}$ varies from 0 to −0.1 V as the top-gate voltage $V_{TG}$ changes from 0 to −6 V. To obtain the N-shaped NDR, the source-drain voltage $V_{DS}$ and the top-gate voltage $V_{TG}$ voltages are swept simultaneously with an equal number of steps while the back-gate voltage $V_{BG}$ remains fixed at a predetermined value. An obtained current-voltage (I-V) curve shows a positive conductance in regions I and III along with negative conductance in region II. Note that the magnitude of a peak current, $I_P$, is about 28 times larger than that of a valley current, $I_V$. A differential conductance, dI/dV, has a negative peak value of −0.58 mS while the positive value is about 0.6 mS. By fixing the back-gate voltage $V_{BG}$ at a different voltage while keeping the source-drain voltage $V_{DS}$ and the top-gate voltage $V_{TG}$ sweep setting, the strength of the NDR effect can be tuned.

Figure 1D:
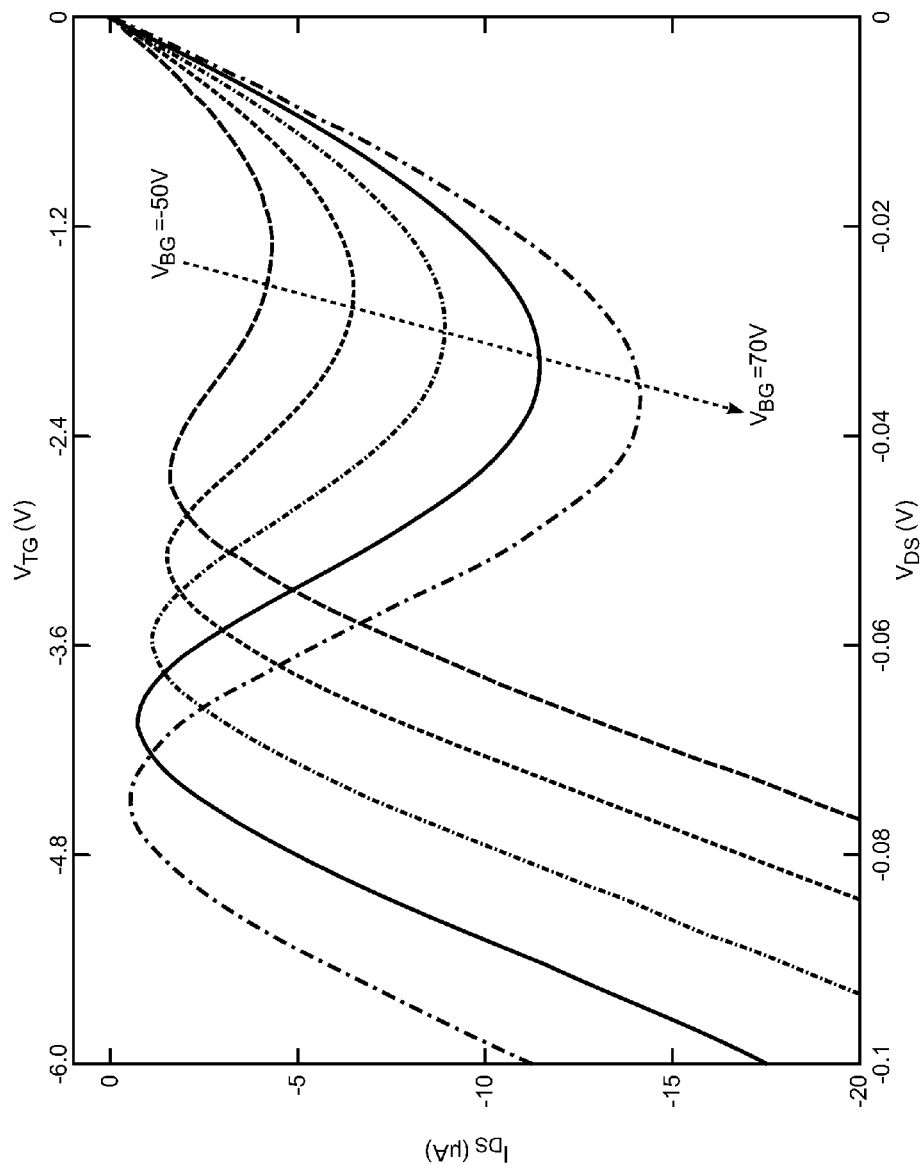
FIG. 1D is a graph depicting tunable NDR effects by changing a back-gate voltage from −50 V to 70 V.

FIG. 1D indicates that the peak-to-valley current ratio $I_P/I_V$ decreases as the back-gate voltage $V_{BG}$ increases from −50 V to 70 V. Transition points for conductance shift from positive to negative and from negative to positive for smaller magnitudes of the source-drain voltage $V_{DS}$. Moreover, the NDR region shrinks with increasing back-gate voltage $V_{BG}$.

Figure 1E:
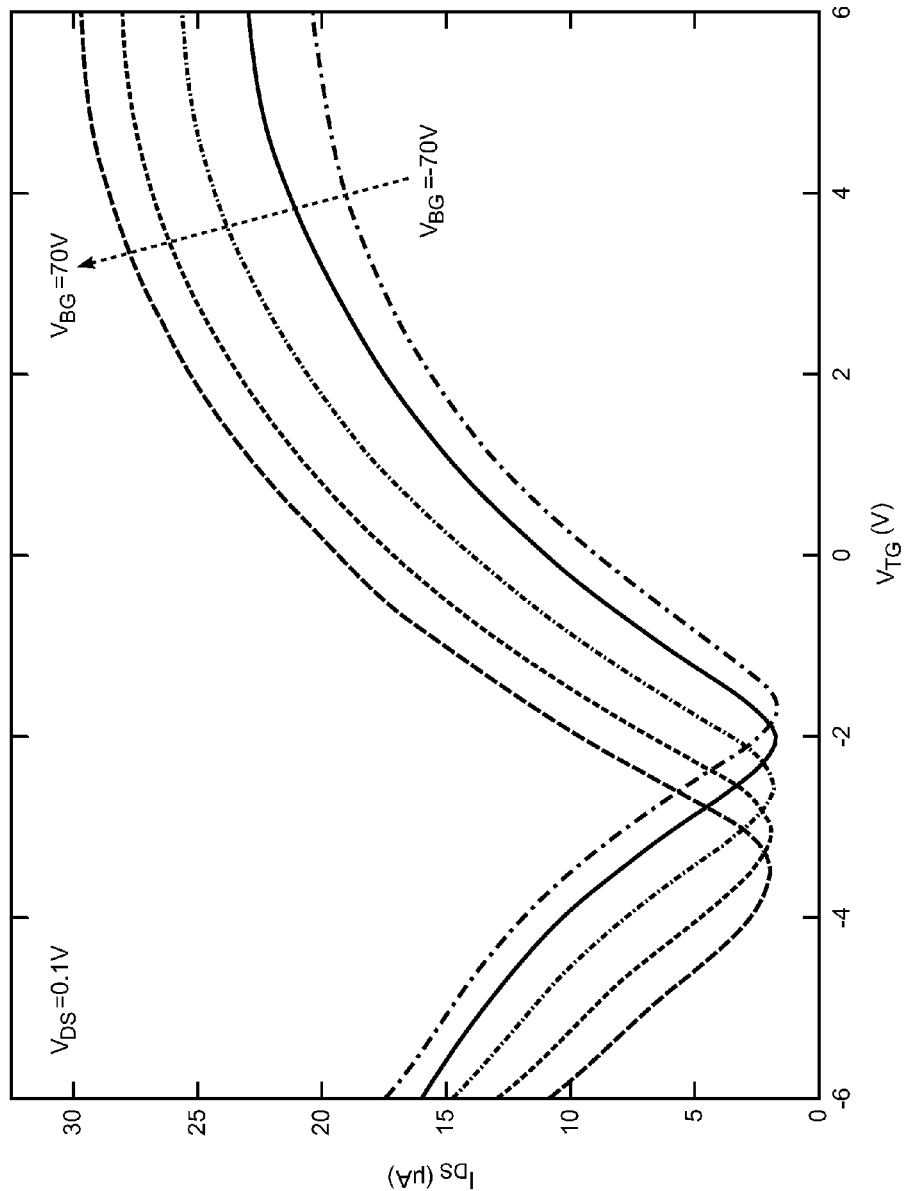
FIG. 1E is a graph of transfer characteristics for a single layer graphene (SLG) dual-gate transistor under various back-gate voltages.
Figure 1F:
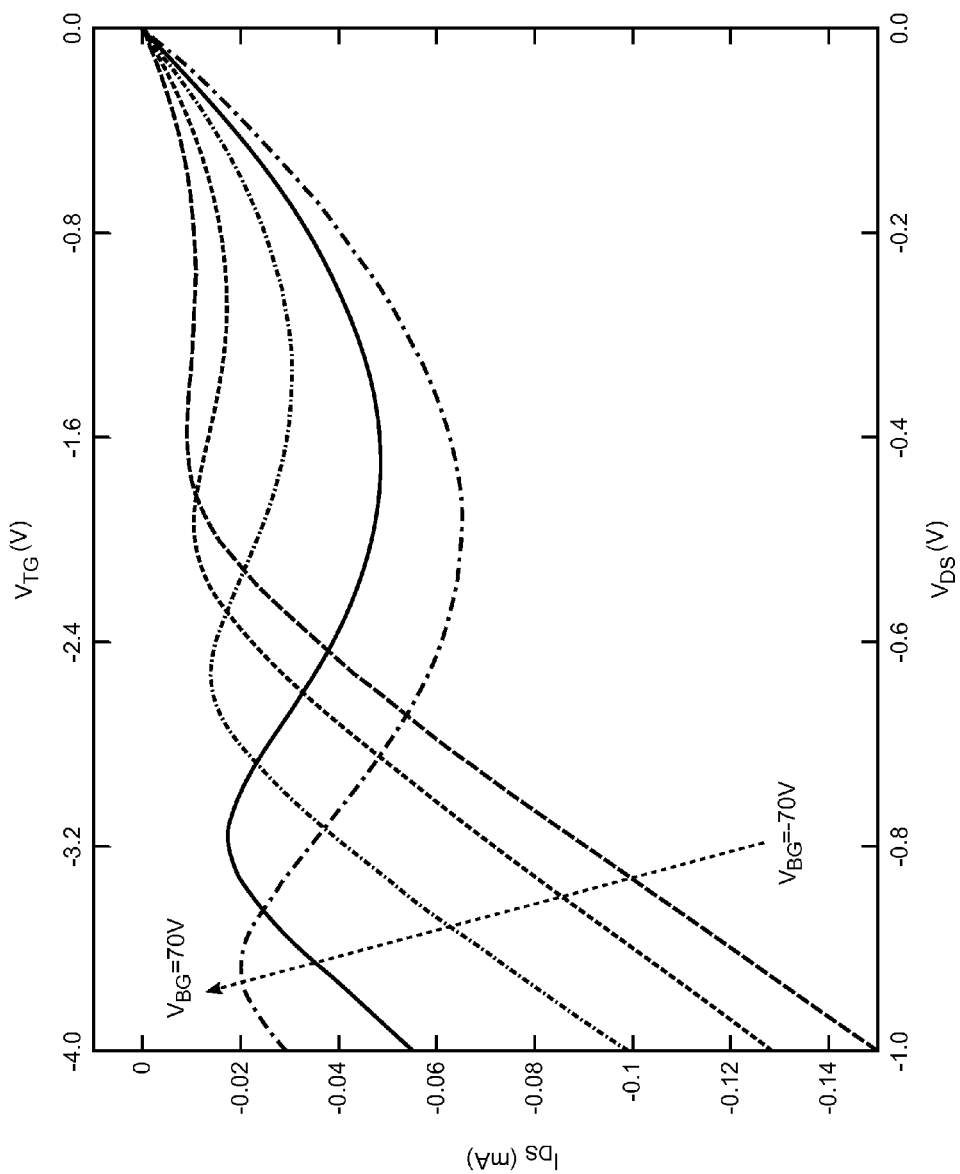
FIG. 1F is a graph depicting NDR for the SLG transistor having the transfer characteristics of FIG. 1E.

FIG. 1E and FIG. 1F show transfer characteristics of SLG and the NDR effect as the source-drain voltage $V_{DS}$ and the top-gate voltage $V_{TG}$ are simultaneously swept. Notice that the NDR effect is still relatively pronounced despite not having a transport gap induced by a displacement field. A key for NDR activation is graphene's symmetric band structure and high carrier mobility. However, the transport gap induced in the BLG dual-gate G-FET 10 (FIG. 1A) can help increase the peak-to-valley current ratio $I_P/I_V$.

Figure 2A:
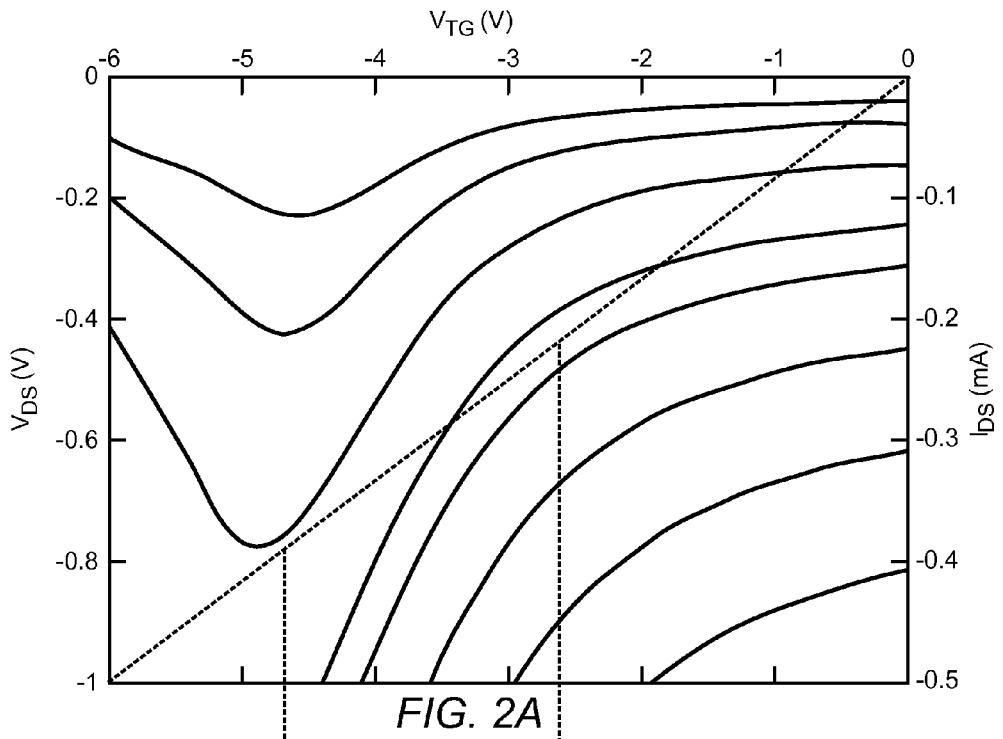
FIG. 2A is a graph of a contour plot of drain to source current for a graphene-based dual-gate transistor under various biasing conditions.

Qualitatively, the NDR effect in graphene can be understood from a contour map depicted in FIG. 2A, which shows source-drain voltage $V_{DS}$-source-drain current $I_{DS}$ curves under different magnitudes of the top-gate voltage $V_{TG}$. In the contour map of FIG. 2A, the x-axis represents the top-gate voltage $V_{TG}$ sweeping from 0 to −6 V while the y-axis represents the source-drain voltage $V_{DS}$ sweeping from 0 to −1 V. A dynamic biasing scheme provided by this disclosure requires simultaneous sweeping of the source-drain voltage $V_{DS}$ and the top-gate voltage $V_{TG}$. Graphically, the dynamic biasing of the present disclosure is equivalent to drawing a diagonal line across the contour map of FIG. 2A. As long as the Dirac point falls within a range that the top-gate voltage $V_{TG}$ is swept, the diagonal line will cross a region where the source-drain current $I_{DS}$ decreases with increasing source-drain voltage $V_{DS}$.

Figure 2B:
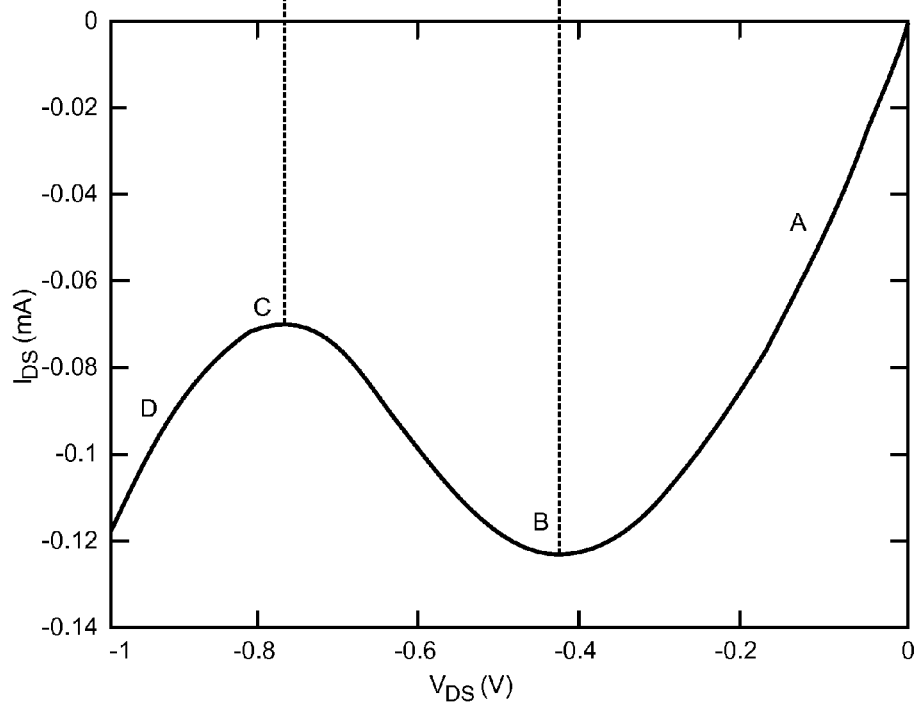
FIG. 2B is a graph of a source-drain current profile along a diagonal line depicted in FIG. 2A resulting from dynamic biasing that sweeps source to drain voltage simultaneously with top-gate voltage.
Figure 2C:
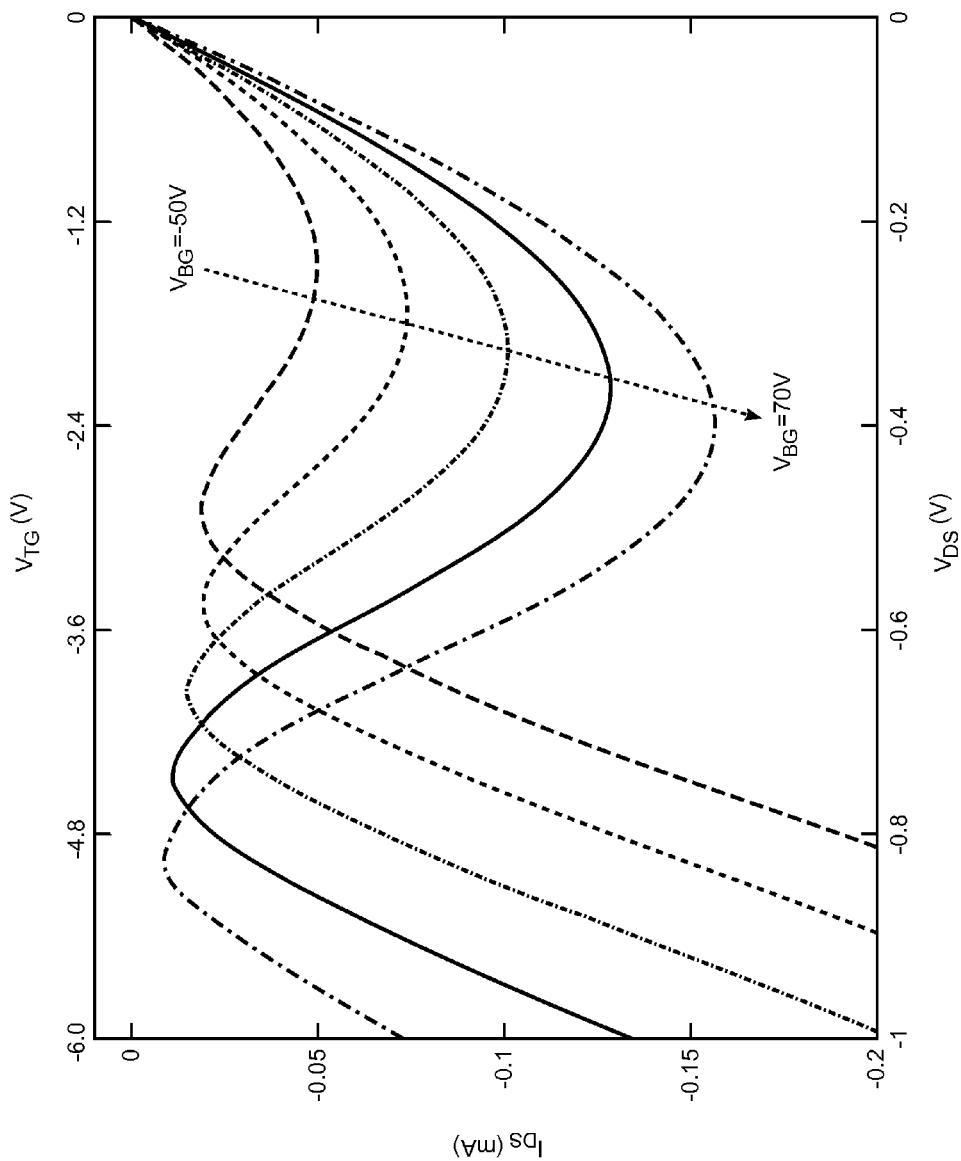
FIG. 2C is a graph depicting NDR as the source to drain voltage is swept from 0 V to −1 V.
Figure 2D:
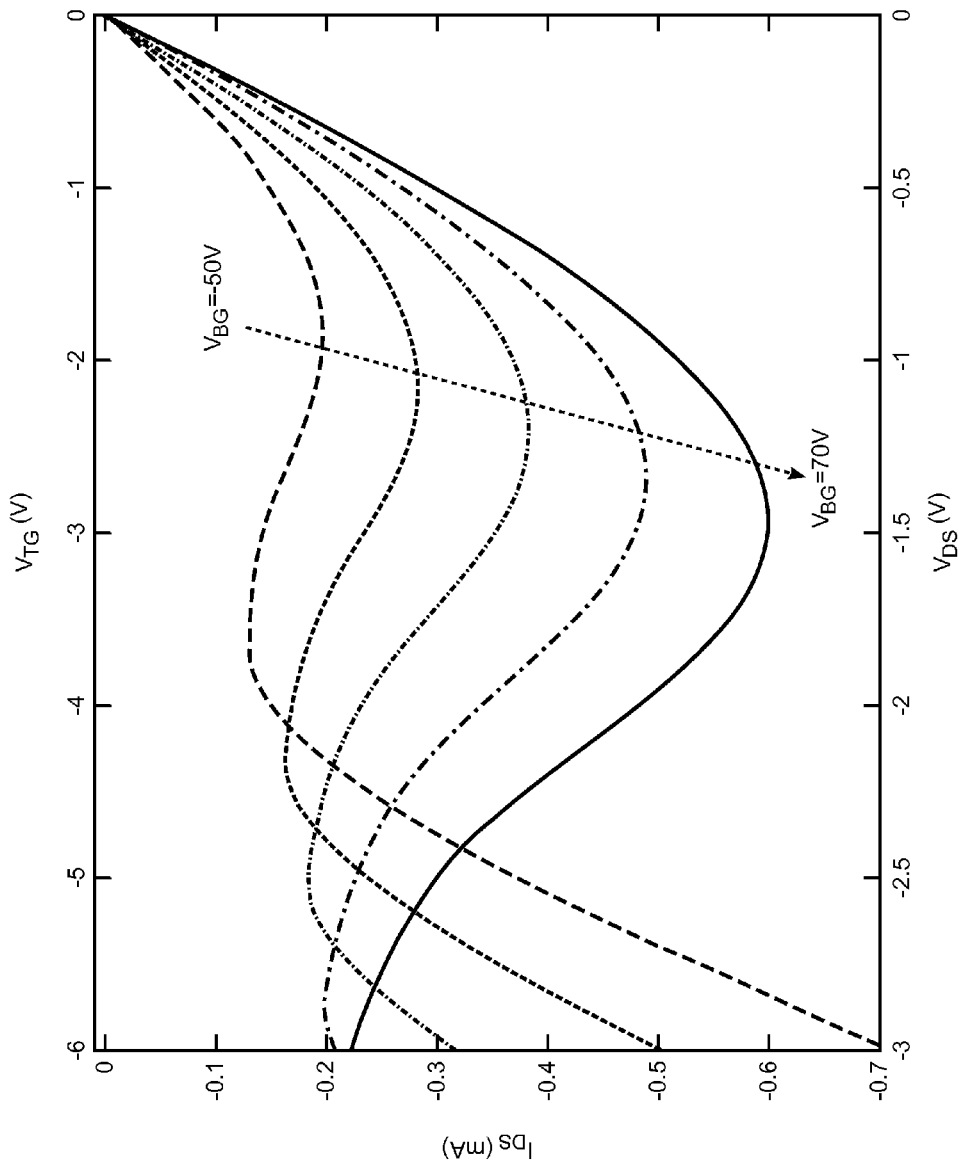
FIG. 2D is a graph depicting NDR as the source to drain voltage is swept from 0 V to −3 V.
Figure 2E:
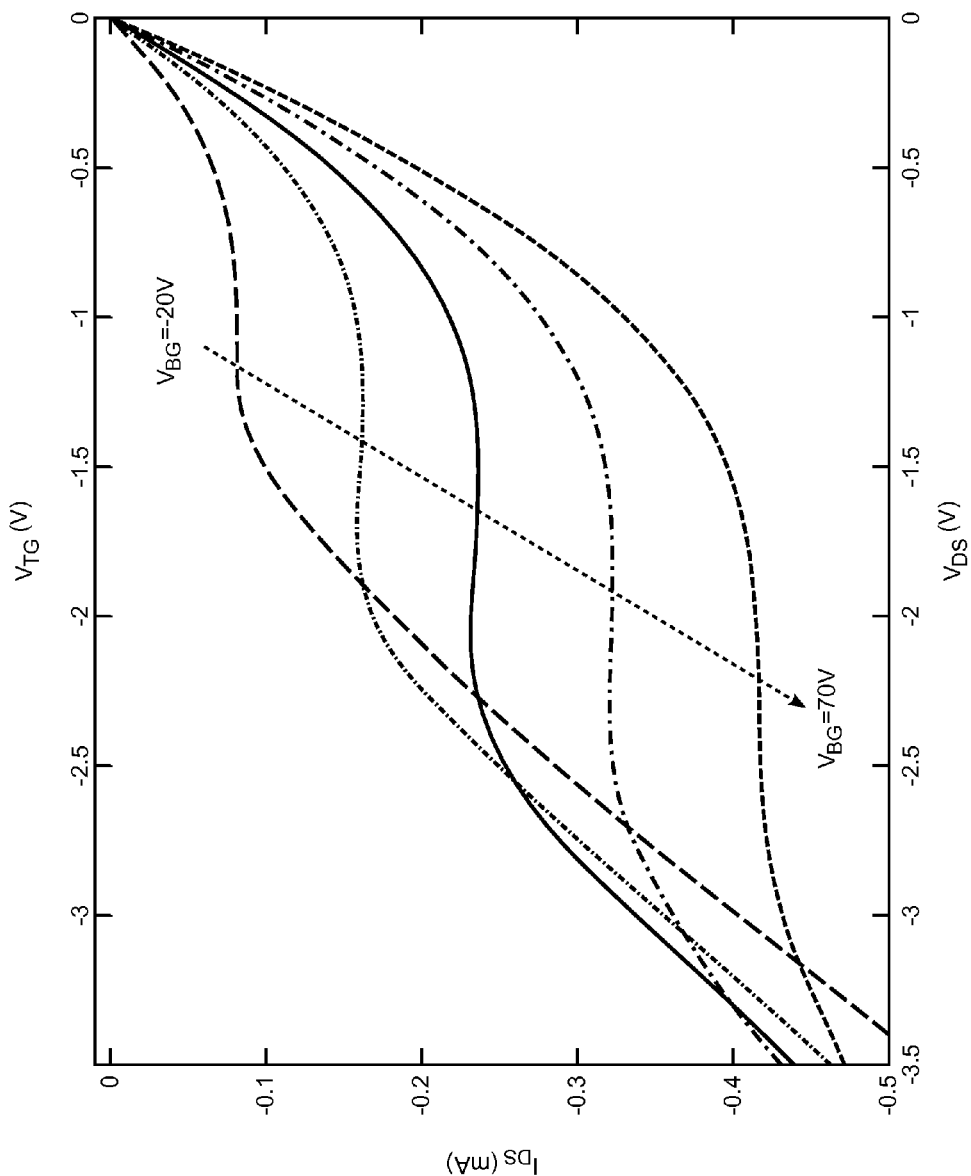
FIG. 2E is a graph depicting a relatively weaker NDR for a graphene-based dual-gate transistor having a drain coupled to the gate in applying a bias from 0 V to −4 V.

FIG. 2B shows a current profile that falls along the diagonal line shown in FIG. 2A. Observe that the NDR effect happens between points B and C. A quantitative description of the NDR effect within the drift-diffusion regime of electric currents in graphene is discussed later. As shown in FIG. 2C and FIG. 2D, the peak-to-valley current ratio $I_P/I_V$ reduces as the source-drain voltage $V_{DS}$ increases during the simultaneous sweep. As shown in FIG. 2E, the NDR effect becomes relatively small when the source-drain voltage $V_{DS}$ and the top-gate voltage $V_{TG}$ are swept within the same range from 0 to −4 V. The reason for the NDR effect becoming relatively small is that as the source-drain voltage $V_{DS}$ increases, a carrier concentration of a channel within the graphene 28 becomes dependent not only on gate bias but also on a drain voltage $V_{DD}$.

Figure 2F:
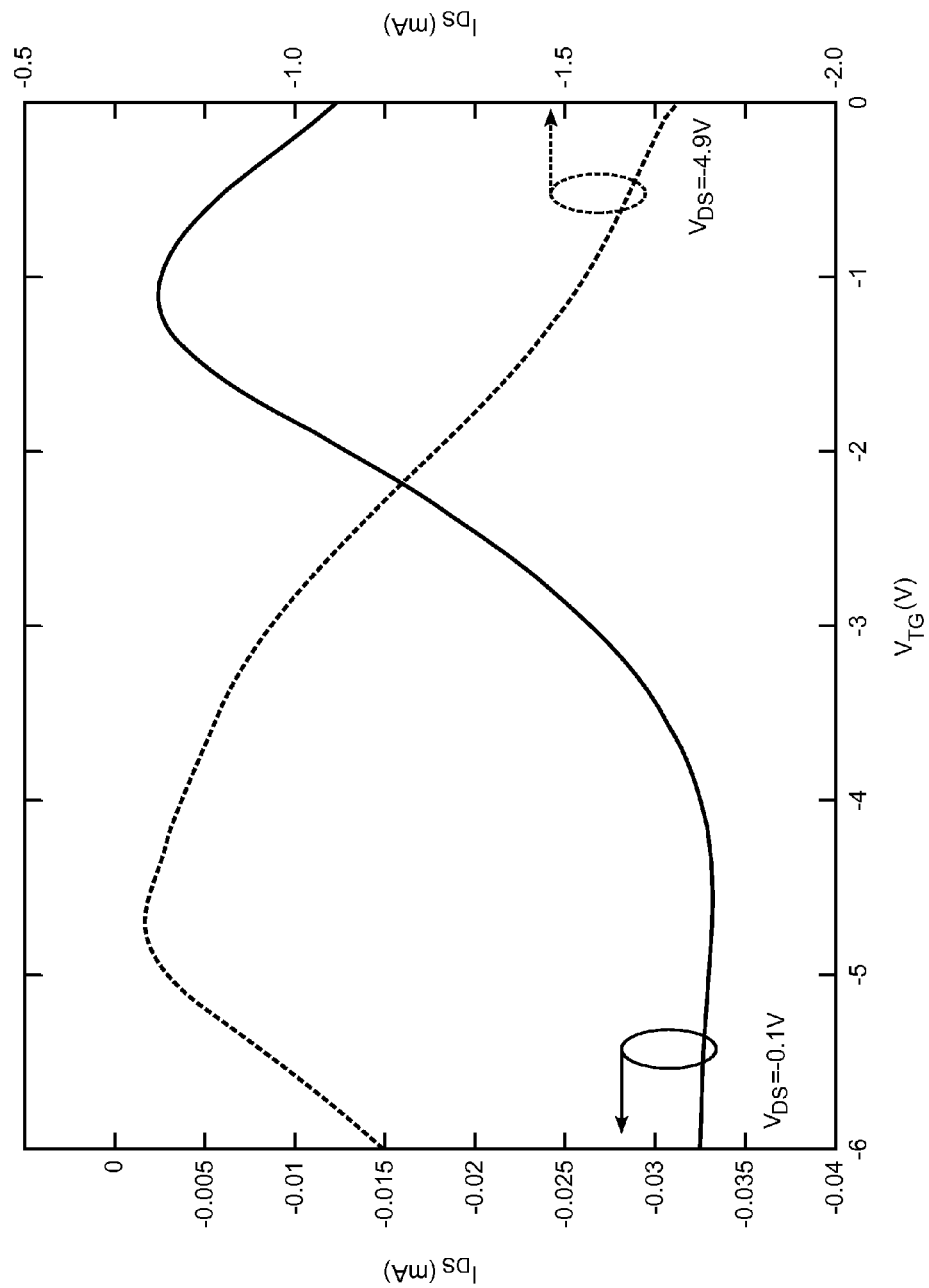
FIG. 2F is a graph depicting transfer characteristics comparing a relatively small source to drain voltage of −0.1 V versus a relatively large source to drain voltage of −4.9 V.

FIG. 2F is a graph depicting a broadening of G-FET transfer characteristics when source-drain voltage $V_{DS}$ increases from −0.1 V to −4.9 V. In this case, a much larger top-gate voltage $V_{TG}$ is needed to change the graphene channel from n type to p type. However, changing the graphene channel from n type to p type weakens the NDR effect.

The disclosed biasing configuration is analogous to diode-connected metal-oxide-semiconductor field-effect-transistors (MOSFETs), which are widely used in modern integrated circuits. Diode-connected MOSFETs, where the gate is connected to the drain, behave similar to a diode. As such, the current starts to increase only when the source-drain voltage $V_{DS}$ and the top-gate voltage $V_{TG}$ are larger than a threshold voltage $V_{TH}$. In embodiments of the present disclosure, the onset of NDR is the result of interplay between decreasing carrier concentration and increasing electrical field along the graphene channel. The high carrier mobility of graphene, along with a high resistance value at the Dirac point, are essential factors for observing a pronounced peak-to-valley current ratio $I_P/I_V$. A sweeping range for the top-gate voltage $V_{TG}$ and the source-drain voltage $V_{DS}$ is defined by a top-gate capacitance and the position of the Dirac point. A relatively larger top-gate capacitance requires a relatively smaller sweeping range for the top-gate voltage $V_{TG}$. Due to technological limitations of the gate oxide made up of ALD-deposited 2 nm/10 nm $AlO_x/HfO_2$, a magnitude of the top-gate voltage $V_{TG}$ is within a range of values that are several times larger than those of the source-drain voltage $V_{DS}$. Due to the n-type doping of the substrate 12 (FIG. 1A) making up the G-FETs of this disclosure, the polarity for both the top-gate voltage $V_{TG}$ and the source-drain voltage $V_{DS}$ was chosen to be negative. However, it is to be understood that G-FETs, in accordance with the present disclosure, can be fabricated with a thinner gate oxide and a higher dielectric constant that will achieve a relatively strong NDR effect within the 1-2 V range. Moreover, coupling the gate and drain together readily transforms a double gate G-FET into a three-terminal NDR G-FET with a widely tunable peak position and a widely tunable peak-to-valley current ratio $I_P/I_V$.

The experimental BLG dual-gate G-FET 10 (FIG. 1A) is large and operates in the drift-diffusion regime. However, for practical applications, electron transport in downscaled computer architectures with devices feature sizes on the order of a few nanometers should be considered. Thus, the present disclosure provides a theoretical analysis of a highly scaled SLG version of a dual-gate G-FET that operates ballistically near the quantum-capacitance limit based upon the BLG dual-gate G-FET 10. Ultimately, analysis determined that such a G-FET, in a diode-connected configuration, will have a current-voltage response exhibiting NDR. Transmission and current-voltage responses are calculated using an atomistic Huckel model within the nonequilibrium Green's function formalism.

Figure 3A:
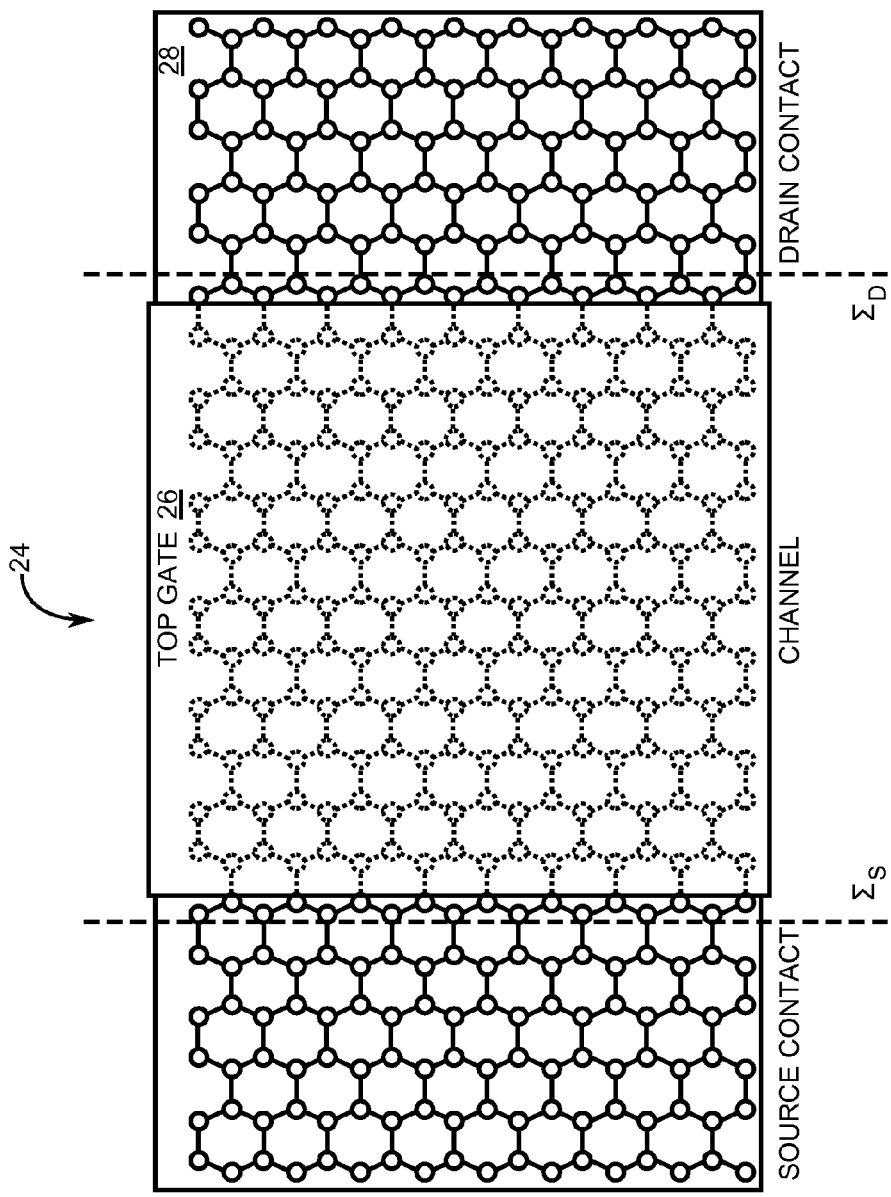
FIG. 3A is a diagram of a biased SLG dual-gate transistor having a biased drain and gate shorted with contact surface self energies.
Figure 3B:
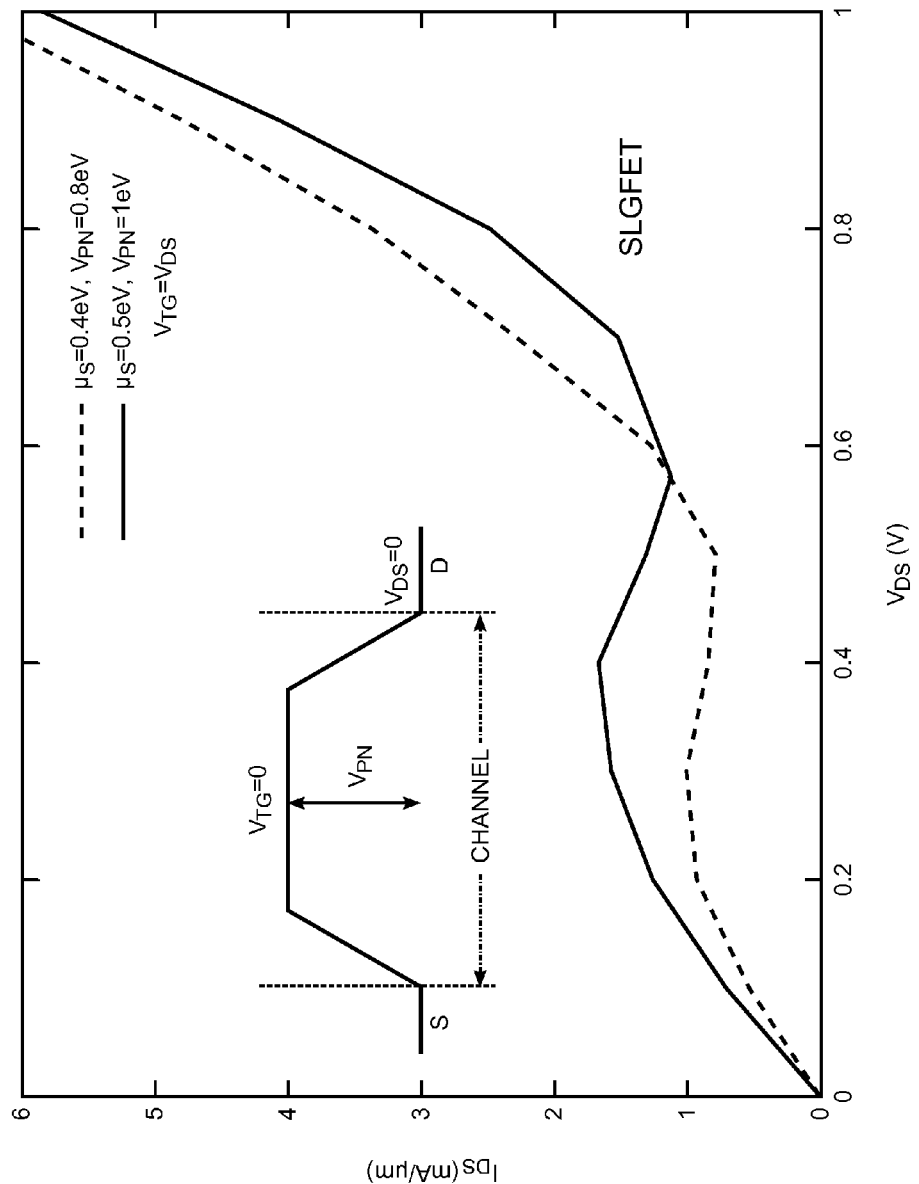
FIG. 3B is a graph depicting current-voltage (I-V) characteristics for different Fermi energy levels.

FIG. 3A is a schematic diagram of an SLG G-FET 24. A high K dielectric top-gate 26 is disposed onto a single layer of pristine graphene 28 that includes a source contact portion, a channel portion, and a drain contact portion. The term high K dielectric used herein refers to a material with a high dielectric constant K that includes but is not limited to such materials as hafnium silicate, zirconium silicate, hafnium dioxide, and zirconium dioxide. To investigate transport properties in the quantum capacitance regime, we consider a 3 nm gate oxide with a dielectric constant K of 25. The calculated gate oxide capacitance ($C_G$) is 7.3 $\mu F/cm^2$. The SLG G-FET 24 is in the quantum capacitance regime when $C_G > C_Q$ where $C_Q$ is the quantum capacitance of the channel. In equilibrium, the source to drain potential profile is that of an npn structure in which the source and drain are both n-type and at the same potential, and the channel is p-type. A built in potential ($V_{pn}$) between the source and the channel region as shown in an inset of FIG. 3B is $V_{pn}=2\mu_s$ where the source Fermi level $\mu_s$ is measured from the charge-neutral point of the source. The current-voltage response shown in FIG. 3B is calculated for a diode-connected SLG G-FET. For the purpose of this disclosure, the term diode-connected means that the gate is shorted to the drain. The I-V response does exhibit NDR, and for a higher value of $\mu_s$, the peak-to-valley current ratio $I_P/I_V$ increases. The I-V response demonstrates NDR for an effective 22 nm channel operating in the ballistic limit and the quantum capacitance regime.

This regime is the opposite of the diffusive regime of the experimental device. Although the transport physics is qualitatively different, the physical mechanism governing the NDR is qualitatively the same. NDR results when the Dirac cone in the channel can be moved sufficiently fast with respect to the gate voltage $V_G$ and the drain voltage $V_{DD}$. In a diode-connected G-FET in the quantum capacitance regime, this ratio is 1:1.

Figure 3C:
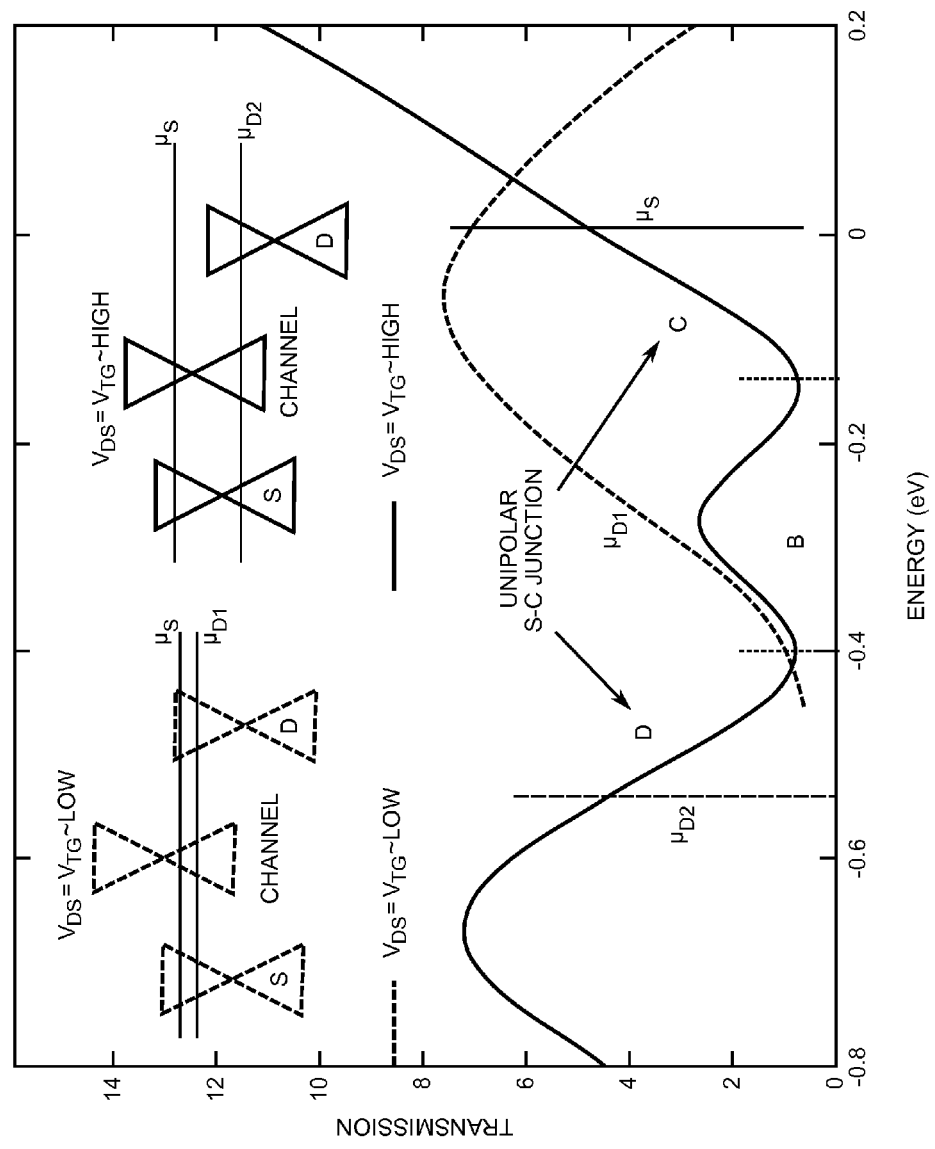
FIG. 3C is a graph depicting transmission coefficients as a function of energy for low and high bias.

FIG. 3C is a graph of transmission curves and corresponding band alignments shown in insets that illustrate the origin of the NDR behavior of the ballistic SLG G-FET 24. At low bias, a transmission curve represented by dashed line corresponds to the band-alignment shown in the upper left inset. The transmission is limited by the transition between the source conduction band and the channel valence band. Conservation of energy and momentum cause the transmission to be proportional to the area of the overlapping inverted triangles representing the electron and hole dispersions. The minimums in the transmission curve represented by dashed line correspond to the energies of the charge neutral points in the source and the channel. The current is proportional to the area under the transmission curve between the source Fermi level ($\mu_s$) and the drain Fermi level ($\mu_{d1}$) shown on the transmission plot. As the bias turns on, this area initially increases and the current increases.

Figure 3D:
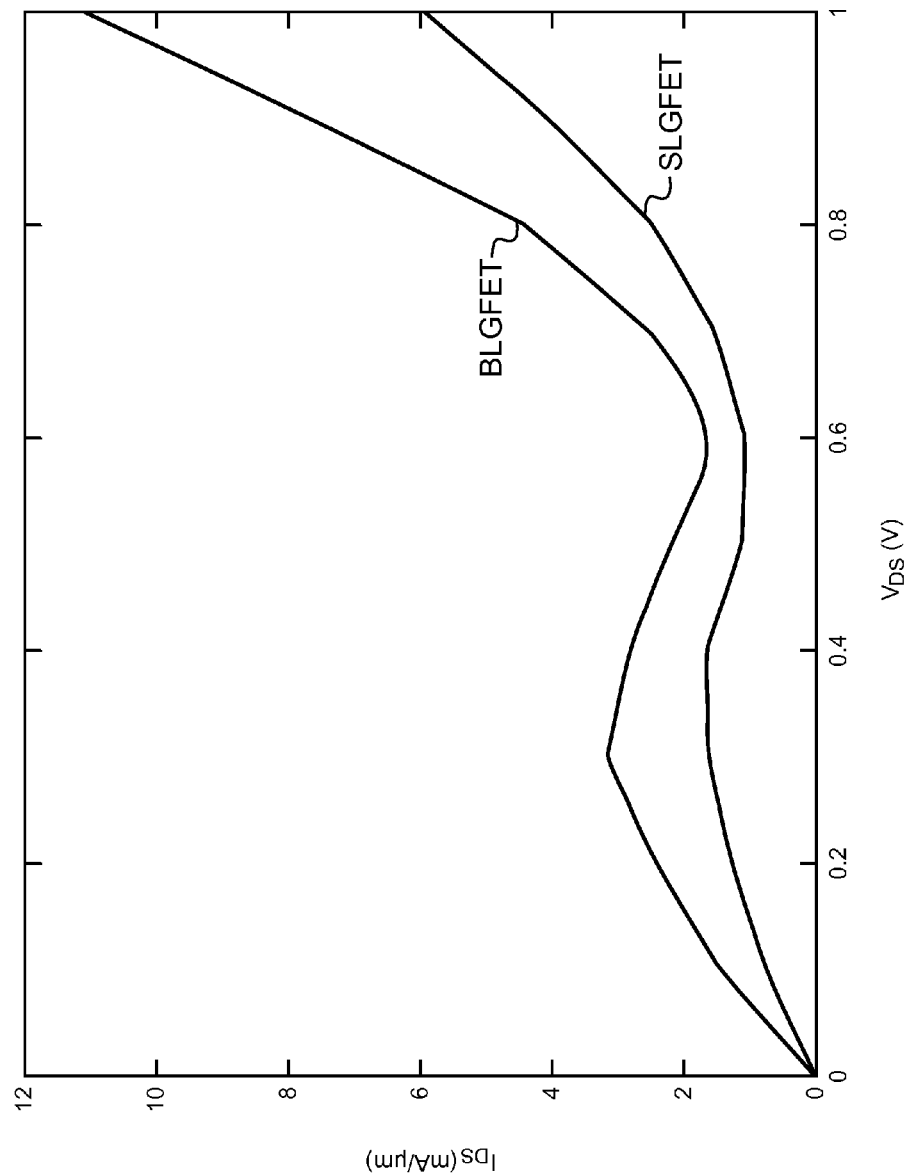
FIG. 3D is a graph depicting a comparison of I-V characteristics for SLG and BLG dual-gate transistors.

As the bias continues to increase, the charge-neutral point of the channel is pulled down into the energy window between the source and drain Fermi levels, as shown in the upper right inset of FIG. 3C, resulting in another transmission curve by solid line. The two minimums in the transmission again correspond to the charge neutral points that have now been brought closer together in energy. The transmission regions labeled 'D' and 'C' result from unipolar transport between the source and channel, hole-hole and electron-electron, respectively. The region labeled 'B,' lying between the two charge-neutral points, results from interband transport between the source conduction band and the channel valence band. The minimum in transmission at negative energies outside of the domain of the graph results from the charge-neutral point of the drain. At this bias, even though the difference between the source and drain Fermi levels, $\mu_s$ and $\mu_{d2}$, respectively, has increased, the area under the transmission curve is a minimum, resulting in the current minimum and NDR. The current-voltage response of the diode-connected BLG dual-gate G-FET 10 (FIG. 1A) is similar to that of the SLG G-FET 24. Dual, 3-nm, high-K, top and bottom gates are required to keep the BLG dual-gate G-FET 10 in the quantum capacitance limit. The gates are shorted, so that the two layers of the bilayer are at equal potential. FIG. 3D shows a comparison of the SLG G-FET 24 and the BLG dual-gate G-FET 10 with the same Fermi levels and built in potentials. The peak-to-valley current ratio $I_P/I_V$ of 2.0 for the BLG dual-gate G-FET 10 is slightly greater than the peak-to-valley current ratio $I_P/I_V$ of 1.8 for the SLG G-FET 24. Analysis of the transmission for the BLG dual-gate G-FET 10 is similar to that of the SLG G-FET 24. Although the density of states is finite at the charge neutral point, it is still a minimum, and the transmission curves look qualitatively the same as in FIG. 3C.

Figure 4A:
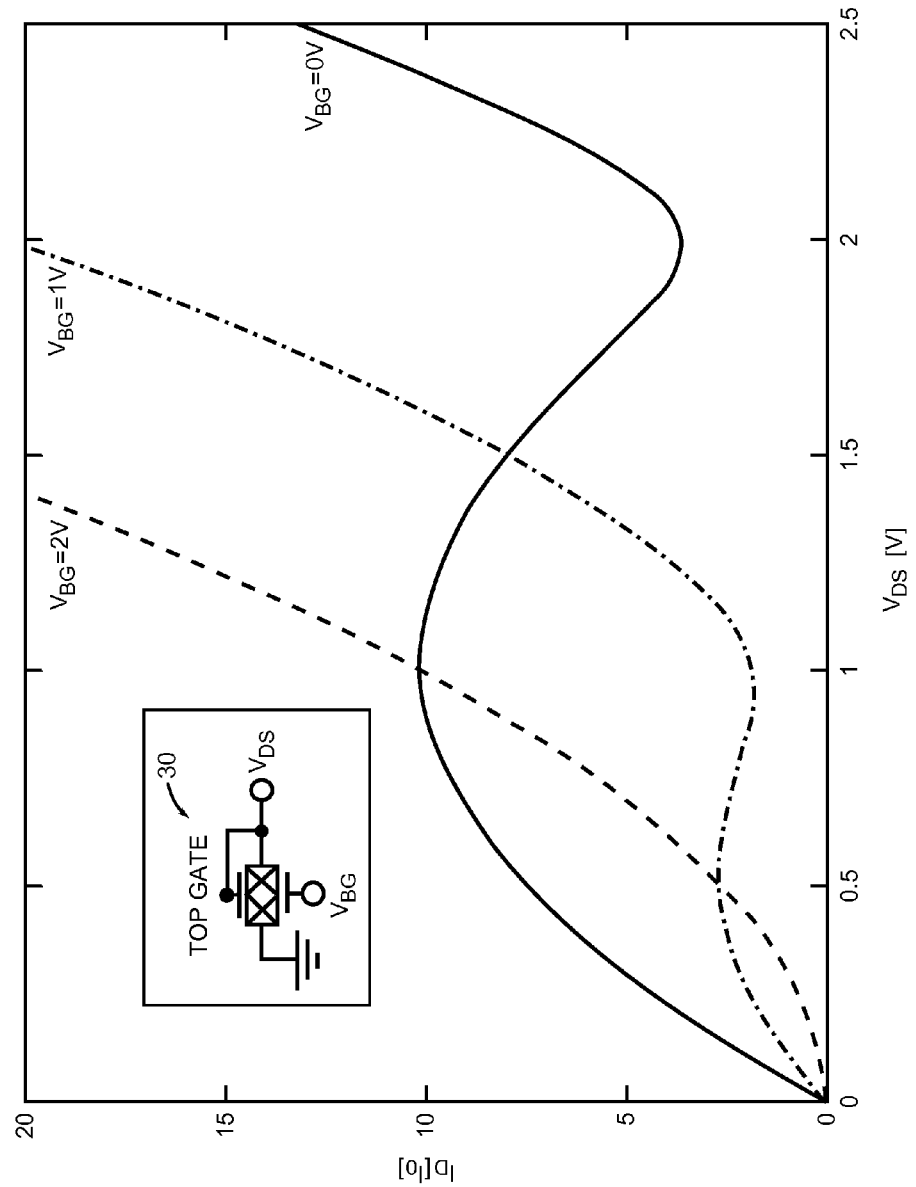
FIG. 4A is a graph of approximate $I_D$-$V_{DS}$ characteristics of a graphene-based dual-gate transistor under various back-gate voltages $V_{BG}$.

FIG. 4A is a graph of numerical simulations using analytical source-drain current $I_{DS}$ vs. source-drain voltage $V_{DS}$ curves extrapolated from experimental and theoretical data. The NDR effect, experimentally observed in the drift-diffusion transport regime and theoretically predicted in the ballistic transport regime, allows the use of pristine graphene in information processing. In order to fully utilize graphene's unique properties, alternative logic circuits are envisioned based on diode-connected G-FETs. An inset of FIG. 4A symbolically depicts a diode-connected G-FET 30. The ability to control NDR with back-gate voltage $V_{BG}$ provides an additional degree of freedom for logic circuit design. An assumption is made that the back-gate capacitance, $C_{BG}$, is equal to one half the top-gate capacitance, $C_{TG}$, ($C_{BG}$=0.5$C_{TG}$) and is introduced as a linear shift for the $V_{TGs}^0$ as follows: $V_{TGs}^0$=1-0.5$V_{BGs}$. The current is shown in normalized units of $I_0$=(W/2L)$\mu en_0 V_{BGs}^0$. Two general trends are observed in the I-V response to the back-gate voltage $V_{BG}$: (1) The NDR region shifts to the left with increasing back-gate voltage $V_{BG}$ and (2) the NDR region shrinks with increasing back-gate voltage $V_{BG}$.

Figure 4B:
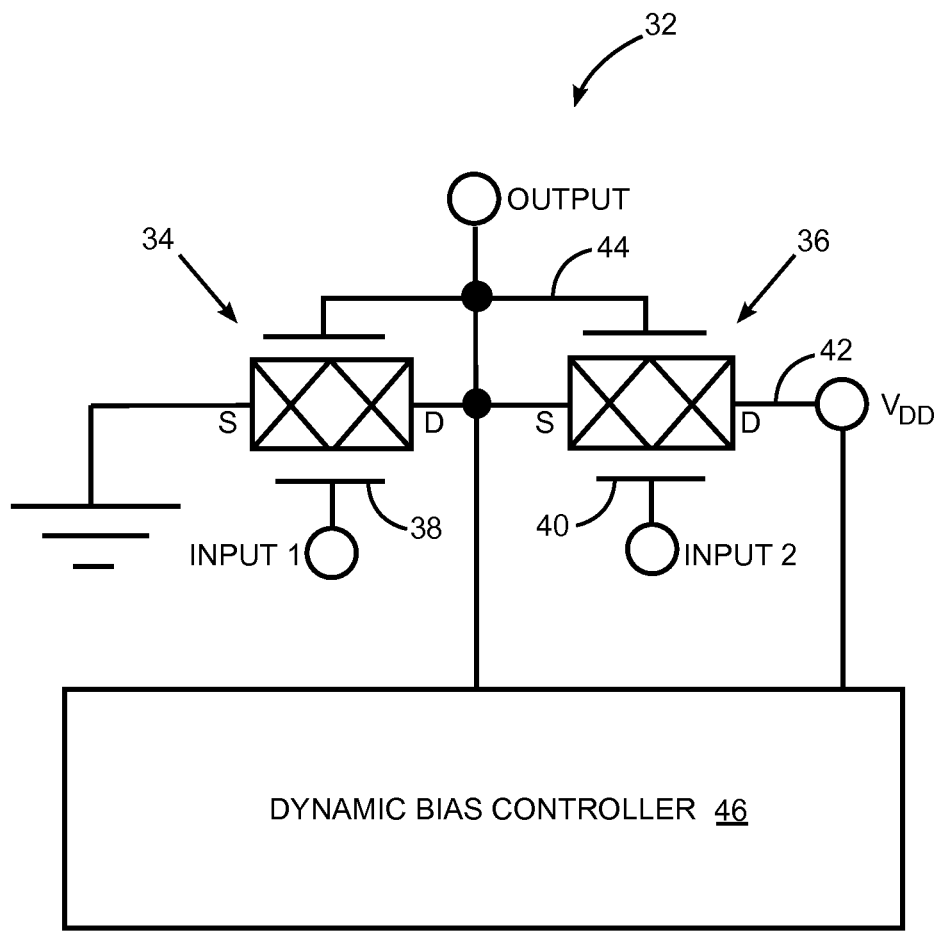
FIG. 4B is a schematic of a building block for fabrication of a graphene logic gate.

FIG. 4B is a schematic of a building block 32 for fabrication of a graphene logic gate. The building block 32 is made up of a first G-FET 34 connected in series with a second G-FET 36. The building block 32 is a four terminal device, where a first back-gate 38 and a second back-gate 40 serve as input terminals INPUT 1 and INPUT 2, one control input 42 with a drain voltage $V_{DD}$, and a common top-gate 44 that serves as a terminal OUTPUT. The output voltage depends on three parameters: the drain voltage $V_{DD}$, and two back-gate voltages $V_{BG1}$ and $V_{BG2}$, which can be controlled independently. There may be one or two stable outputs depending on the combination of the control voltages. A dynamic bias controller 46 coupled to the building block 32 controls the biasing needed to realize the one or more stable outputs. The dynamic bias controller 46 is configured to simultaneously sweep a source-drain voltage and a top-gate voltage across a Dirac point to provide operation within the NDR region. The dynamic bias controller 46 includes circuitry (not shown) that is typically made up of analog or analog/digital voltage ramp generators configured to simultaneously sweep a source-drain voltage and a top-gate voltage across a Dirac point to provide operation within the NDR region.

Figure 4C:
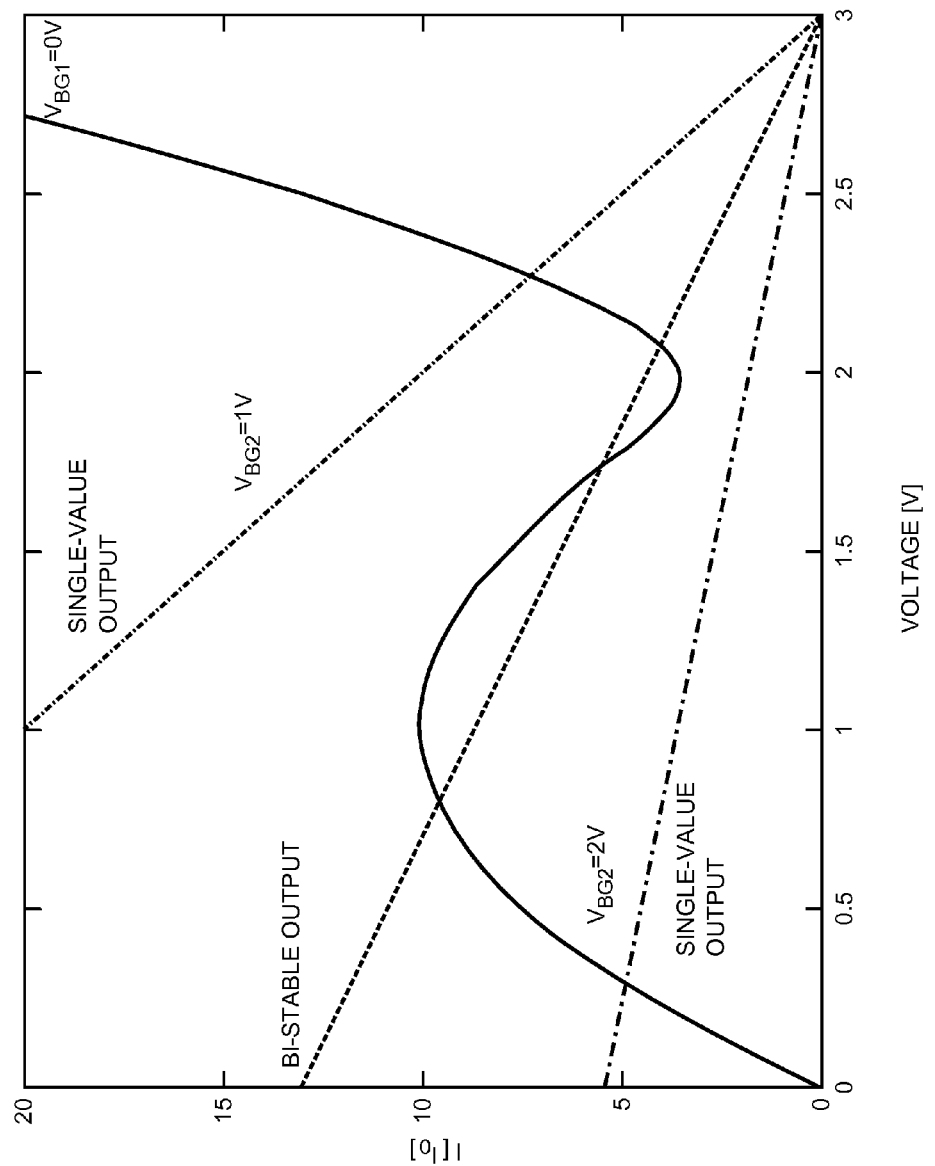
FIG. 4C is a graph depicting results of numerical modeling illustrating possible combinations of input voltages leading to single-value and bi-stable outputs for the building block of FIG. 4B.

The plots in FIG. 4C illustrate the possible scenarios for two I-V curves intersection leading to single-value output or bi-stable output.

Figure 4D:
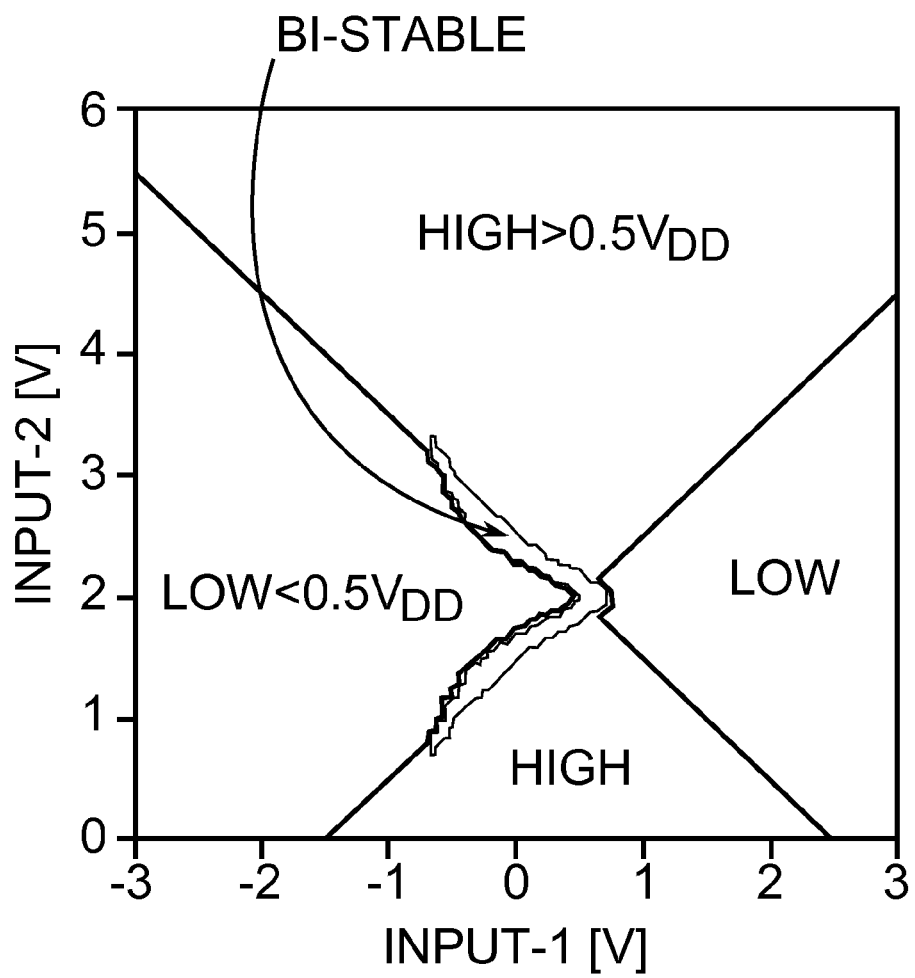
FIG. 4D is a graph depicting results of numerical simulations in a map that shows output voltage as a function of four different inputs at a fixed $V_{DD}$ for the building block of FIG. 4B.

FIG. 4D depicts a map of the possible output voltages depending on two back-gate voltages $V_{BG1}$ and $V_{BG2}$ being maintained at a fixed $V_{DD}$. An arrow extending from the label BI-STABLE points to a bi-stable region in 2D space where the output has two stable values. Triangular shaped areas within the map depict regions of a single-value output. Triangular regions horizontally adjacent to the bi-stable region represent a "low" output $V_{out}$<0.5 $V_{DD}$. Triangular regions vertically adjacent to the bi-stable region represent a "high" output $V_{OUT}$>0.5 $V_{DD}$.

Figure 4E:
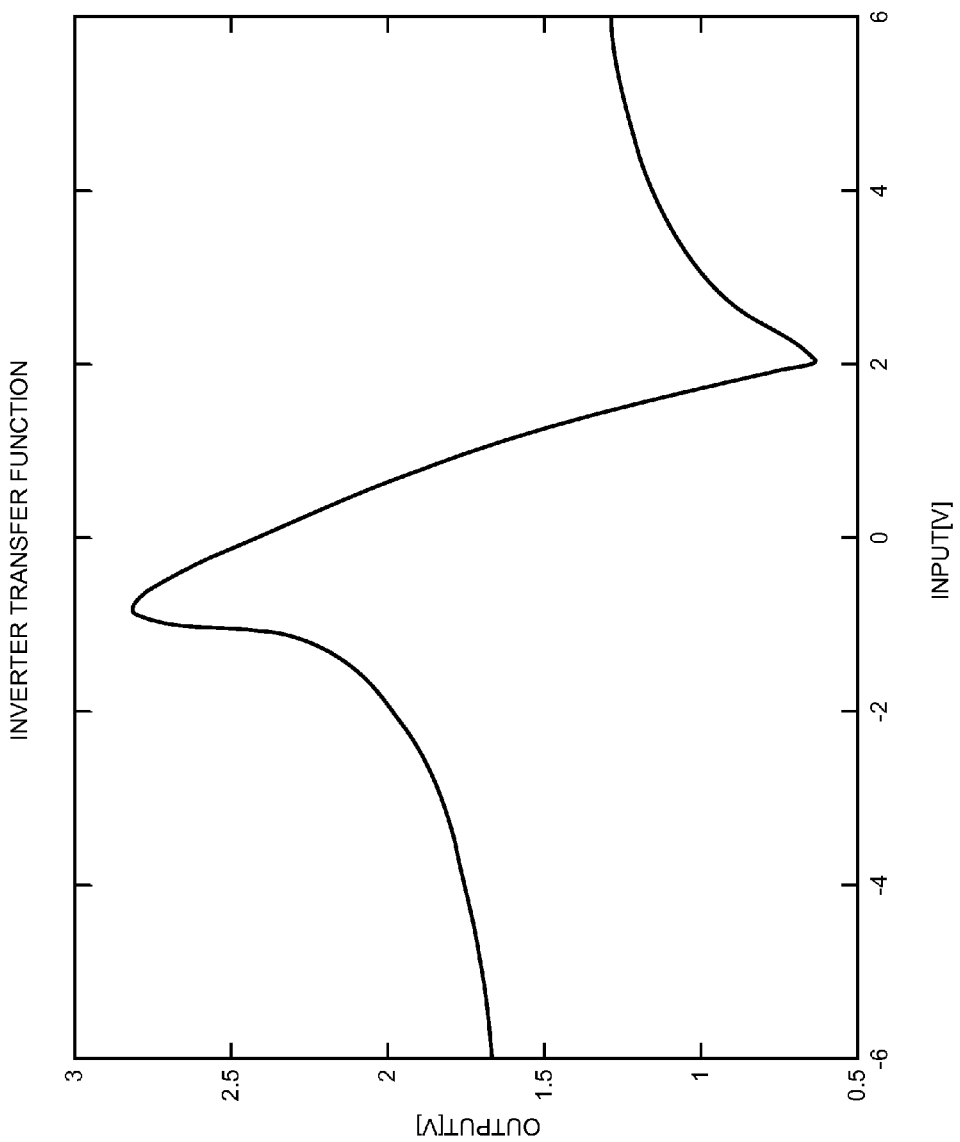
FIG. 4E is a graph depicting numerical simulations of an inverter function realizable with proper biasing of the building block of FIG. 4B.
Figure 4F:
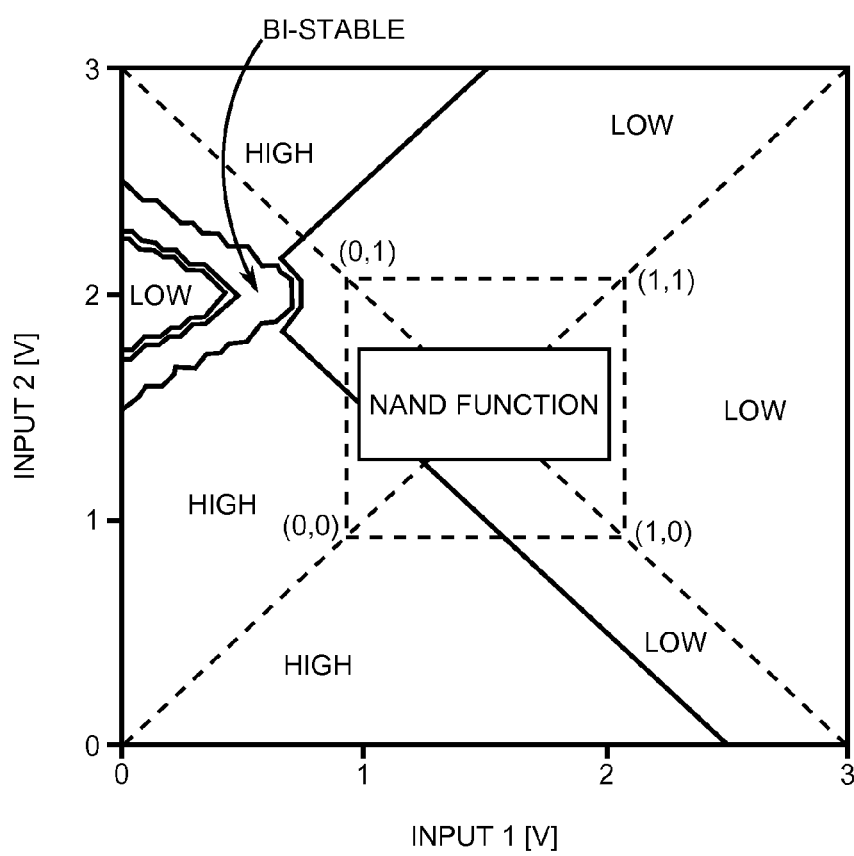
FIG. 4F is a graph depicting results of numerical simulations in a map that shows output voltage as a function of four different inputs that provide a NAND function using the building block of FIG. 4B.

The first G-FET 34 and the second G-FET 36 shown in FIG. 4B can be used as a building block for a variety of logic gates. The regions with the single-valued output can be used for Boolean logic gates, while the bi-valued regions are of great promise for application in a non-Boolean logic made up of non-linear networks. For example, NAND and NOT logic gates can be realized by using the building block 32 (FIG. 4B) comprising the first G-FET 34 and the second G-FET 36 connected in series. As illustrated in FIG. 4E and FIG. 4F, the same building block 32 can be biased to realize both an inverter logic function and a NAND logic function. In order to realize the inverter logic function, the back-gates of the two transistor diodes (not shown) should receive the same input voltage such that back-gate voltage $V_{BG1}$ is equal to back-gate voltage $V_{BG2}$. It is then possible to find the $V_{DD}$ value leading to the inversion function. The results of numerical modeling in FIG. 4E show the input-output voltage dependence at $V_{DD}$=3 $V_0$. A low input voltage corresponds to a high output, and vice versa, which is equivalent to outputs for a logic NOT gate. The gain of a typical G-FET circuit, $\Delta V_{OUT}/\Delta V_{IN}$, depends on the strength of the back-gate modulation a as well as on the peak-to-value current ratio $I_P/I_V$ of the NDR region. NAND gate logic can be also realized by using the building block 32 with a proper choice of $V_{DD}$ and input voltages. The process of finding the right input voltages is illustrated in FIG. 4F. Note that the results presented in FIG. 4D were taken as input data. In order to build a NAND gate, a region in the map needs to be located where the low-input voltages (logic 0) correspond to the high output (logic 1). Input voltages of 1.7 $V_0$ and 4.5 $V_0$ satisfy such a condition at $V_{DD}$=3 $V_0$. All other Boolean logic gates can be constructed via different variations of NAND gate.

However, the potential of NDR characteristics of G-FETs can be more fully realized in building the non-Boolean logic architectures. The concept of the non-linear network based on the devices having resonant tunneling diode (RTD) function is a well-known example of a non-Boolean approach. To date, this approach was limited to tunneling diodes, which are two-terminal devices. Utilization of diode-connected G-FETs offers a three-terminal device with NDR. Three-terminal devices with NDR allows one to build ultra-fast non-linear networks with enhanced logic capabilities.

Figure 5A:
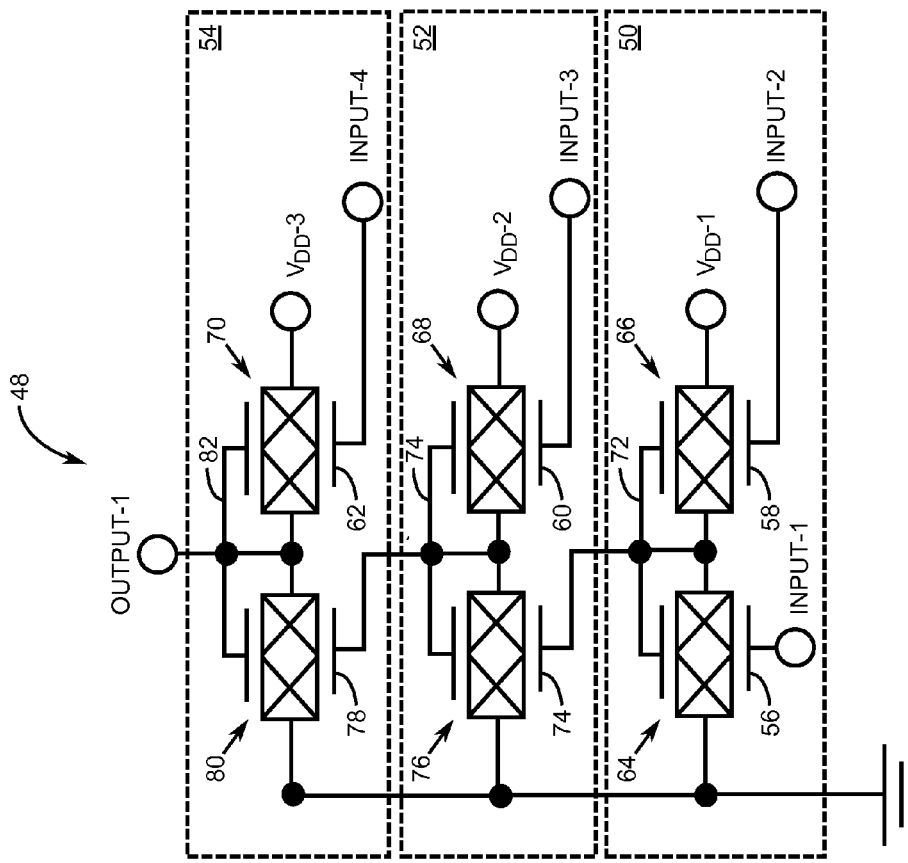
FIG. 5A is a schematic of a multi-stage network made up of G-FETS that is suitable for realizing non-Boolean logic information processing architectures.

FIG. 5A is a schematic of a multi-stage network 48 made up of G-FETs that is suitable for realizing non-Boolean logic information processing architectures. The multi-stage network 48 is made up of a first stage 50, a second stage 52, and a third stage 54, each of which is biased by a separate bias voltage $V_{DD}$, listed in FIG. 5A as $V_{DD-1}$, $V_{DD-2}$, and $V_{DD-3}$ with a value that can vary from stage to stage. Input voltages INPUT-1, INPUT-2, INPUT-3, and INPUT-4 are applied to back-gates 56, 58, 60, and 62 of G-FETS 64, 66, 68, and 70, respectively. Top-gates 72 of the first stage 50 are connected to back-gate 74 of a G-FET 76 coupled in series with G-FET 68 of the second stage 52. Top-gates 74 of the second stage 52 are connected to back-gate 78 of a G-FET 80. Top-gates 82 of the third stage 54 are coupled to output terminal OUTPUT-1. The multi-stage network 48 realizes a multi-valued logic unit with bi-stable outputs being provided by each of the first stage 50, the second stage 52, and the third stage 54.

Figure 5B:
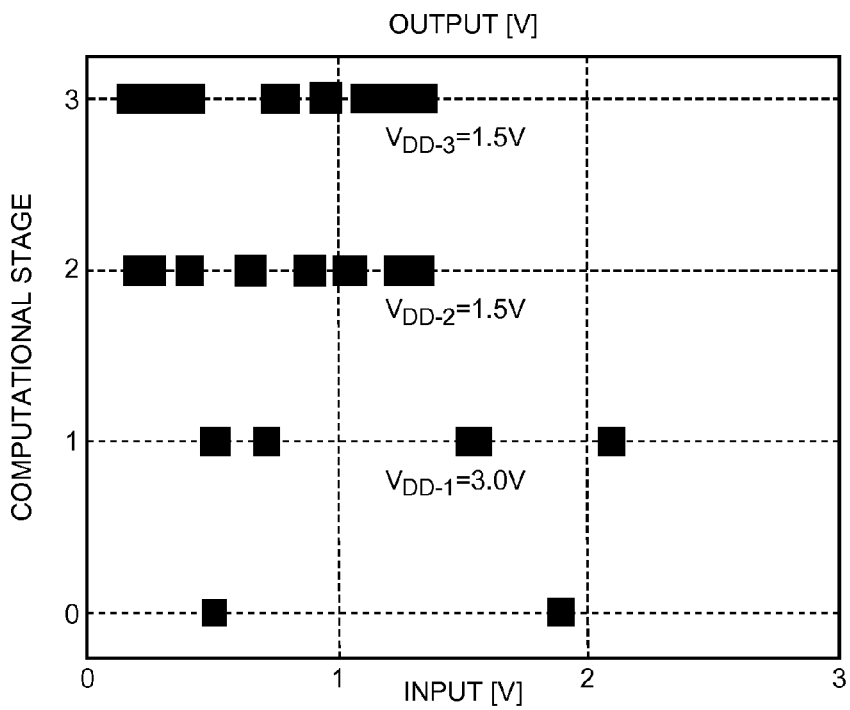
FIG. 5B is a graph depicting output values of each of the computational stages of the multi-stage network of FIG. 5A for last stages having a drain voltage $V_{DD}$ fixed at 1.5V.
Figure 5C:
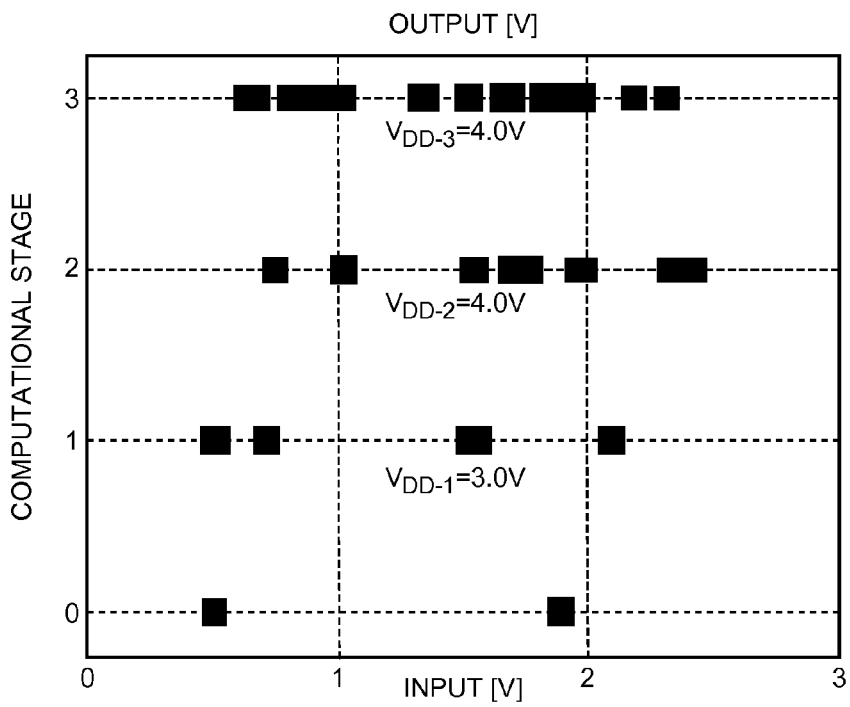
FIG. 5C is a graph depicting output values of each of the computational stages of the multi-stage network of FIG. 5A for last stages having $V_{DD}$ voltages fixed at 4.0V.

Results of numerical modeling for the multi-stage network 48 are presented in FIG. 5B and FIG. 5C that each illustrates output values (rectangular markers) for the first stage 50, the second stage 52, as well as an ensemble of output values provided by the third stage 54. In this example, all inputs are chosen to have either $0.5 V_0$ or $1.9 V_0$, which is a combination that leads to a bi-stable output at $V_{DD}=3.0$ V as shown in FIG. 4C. Thus, the output of the first stage 50 may have five possible stable values for the four possible input combinations. The number of possible output values depends on the inputs as well on bias voltages $V_{DD-1}$, $V_{DD-2}$, and $V_{DD-3}$. The results of the numerical modeling show three evolution trees for different combinations of bias voltages $V_{DD-1}$, $V_{DD-2}$, and $V_{DD-3}$. The input and bias voltages $V_{DD-1}$, $V_{DD-2}$, and $V_{DD-3}$ are predetermined values leading to an increased number of output states.

The output patterns shown in FIG. 5B and FIG. 5C resemble the operation of the von Neumann cellular automata model, where the existence or absence of the stable output in a certain value interval is analogous to the logic 0 or 1. For example, one can imagine the whole space of possible output voltages to be divided into the cells, e.g. of $0.5 V_0$ width. The presence of a stable output in the given voltage interval can be interpreted as a logic 0, and the absence of the stable output can be assigned to logic 1. This type of multi-valued network can be conceptualized as voltage-space cellular automata, where an individual cell is not related to a real circuit or structure. Though there is no physical object related to an individual cell, the logic output can be easily recognized by measuring corresponding output voltages. The multi-stage network 48 can be modified in a number of ways, e.g. by increasing the number of G-FETs per stage, introducing a time-varying bias voltage, $V_{DD}(t)$, or increasing a number of interconnects among the stages. The proposed ultra-fast non-Boolean logic circuits, implemented with G-FETs connected to realize NDR characteristics, can be used to construct a new type of cellular automata particularly suitable for special task data processing such as image recognition, data encryption, and database searching.

Special task data processing logic circuits is another promising direction for G-FET implementation. It would be of great practical benefit to develop graphene-based analog logic circuits able to complement the ability of complementary metal-oxide semiconductor (CMOS) technology to perform specific operations which require enormous resources for conventional digital counterparts. One example is pattern matching, which is widely used for database searching, spell checking and signal processing tasks. The essence of the pattern matching operation is the act of checking a stream of input data for matches to a reference data stream. The main challenge for this application is to perform high throughput operation to match the speed of the gigabit network. The inevitable development of 100 Gbps-scale data networks would make real time network intrusion detection impossible even using the most optimistic assumptions for scaling CMOS. That is one of the cases where unique properties of graphene may be utilized to complement the existing technology.

Figure 5D:
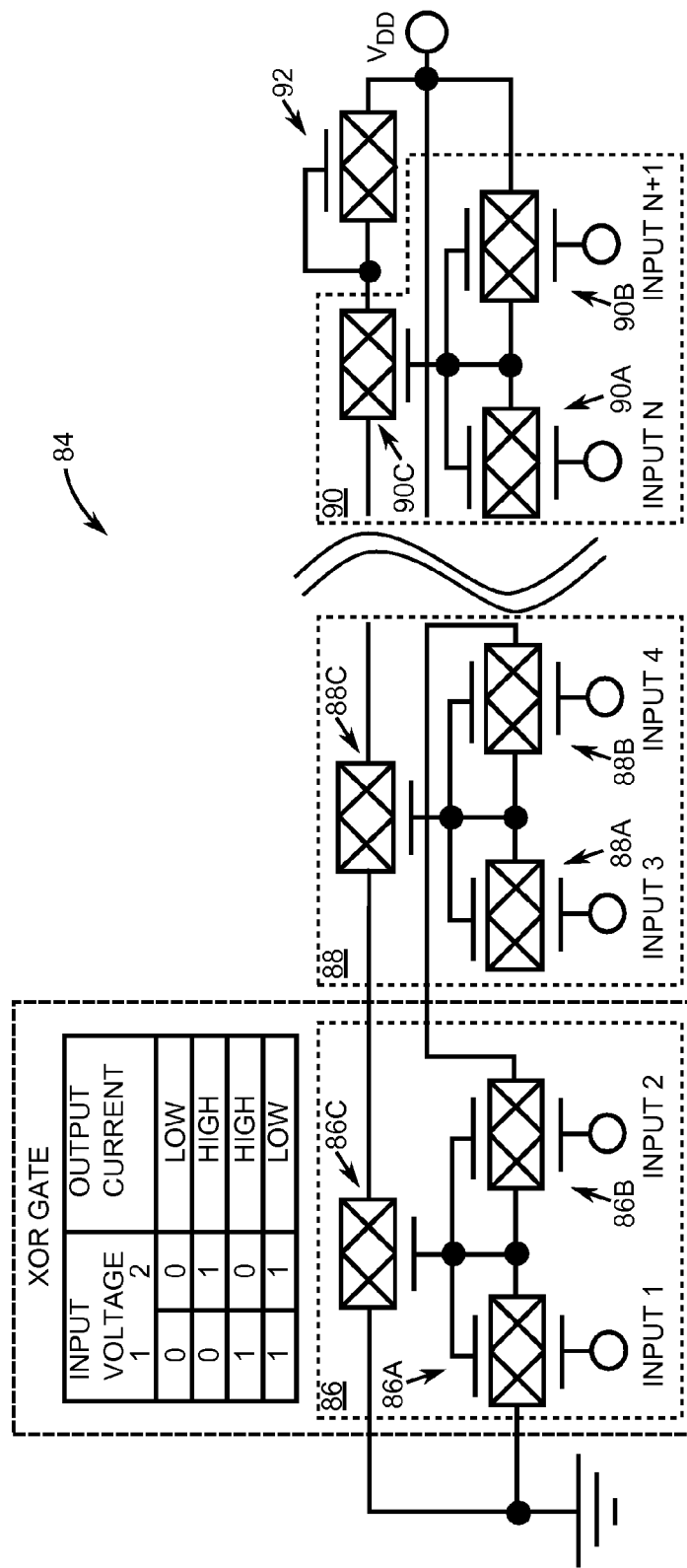
FIG. 5D is a schematic for a pattern matching circuit made up of G-FETs in accordance with the present disclosure.
Figure 5E:
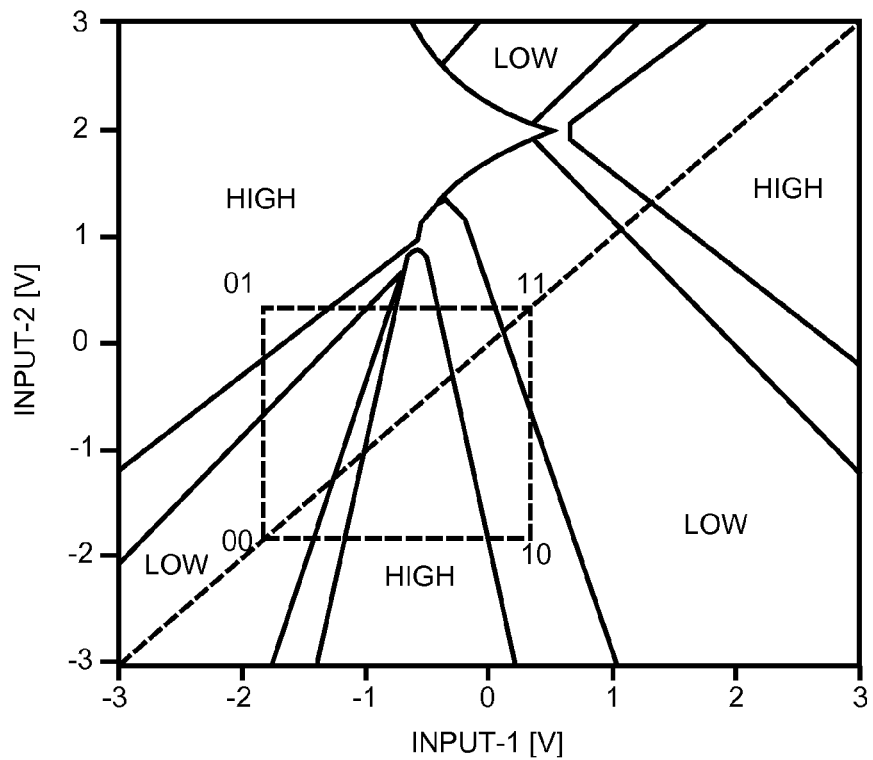
FIG. 5E is a graph depicting results of numerical simulations in a map that shows output voltages corresponding to 00 and 11 logic states are matched to a Dirac point, which provides minimum conductivity for the second stage G-FET of the pattern matching circuit of FIG. 5D.

FIG. 5D is a schematic for a pattern matching circuit 84 made up of G-FETs in accordance with the present disclosure. The pattern matching circuit 84 is made up of a number of elementary cells connected in series, where each elementary cell comprises three G-FETs arranged in a two-stage circuit. The first elementary cell 86 comprises a first G-FET 86A, a second G-FET 86B, and a third G-FET 86C; the second elementary cell 88 comprises a first G-FET 88A, a second G-FET 88B, and a third G-FET 88C; and the Nth elementary cell 90 comprises a first G-FET 90A, a second G-FET 90B and a third G-FET 90C. In FIG. 5D, the first elementary cell 86 and the second elementary cell 88 are coupled in series with the Nth elementary cell 90 having an output G-FET 92. The input data are applied to the two inputs of the first stage G-FETs of the first elementary cell 86. Input voltages $V_1$ and $V_2$ represent two logic states 0 and 1, respectively. One of these voltages corresponds to the input data stream and the other corresponds to the reference data. The values of the input voltages are selected to provide the same voltage output of the first stage if and only if $V_1=V_2$, which corresponds to the logic states 00 or 11. The output voltage of the first stage is then applied to the back-gate of the second stage transistor. The output voltage corresponding to 00 and 11 states is matched to the Dirac point, providing minimum conductivity of the second stage transistor as illustrated in FIG. 5E. Overall, the first elementary cell 86 functions as an XOR gate providing minimum current for 00 and 11 inputs. Similarly, the remainder of the pattern matching circuit 84 comprises a number of XOR gates, which in this example are the second elementary cell 88 and the Nth elementary cell 90 connected in series.

Figure 5F:
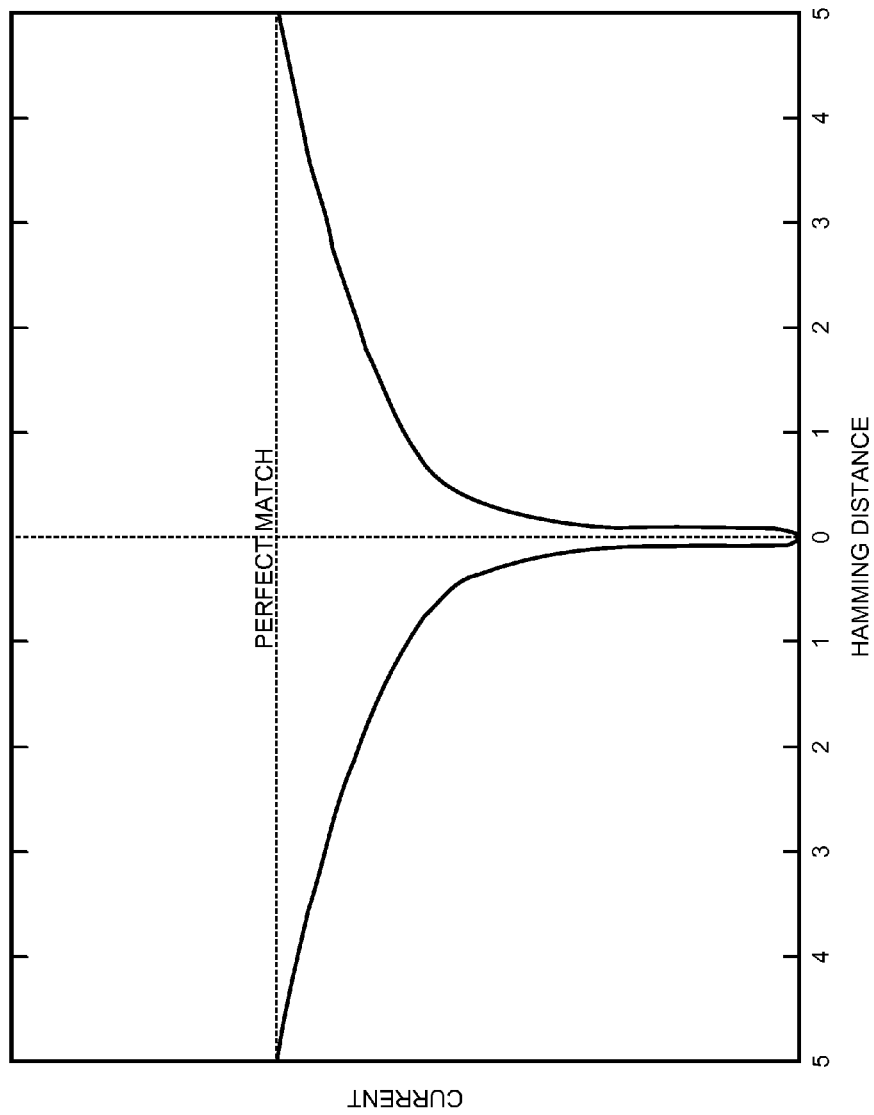
FIG. 5F is a graph illustrating that current flowing through the upper transistors decreases with a decrease of the Hamming distance between an input data string and a reference data string.

FIG. 5F is a graph showing that current flowing through the upper G-FETs 86C, 88C, and 90C decreases with a decrease of the Hamming distance between an input data string and a reference data string. This current has an absolute minimum in the case of a perfect match where zeros and ones of the input data matches zeros and ones of the reference data.

The pattern matching circuit 84 shown in FIG. 5D has several important advantages in terms of area, speed and overall functional throughput over existing CMOS circuits. One advantage is that the elementary XOR gate requires only three G-FETs whereas a minimum of eight transistors are needed for an XOR function in CMOS. Moreover, an area per G-FET can be as small as 10 nm×40 nm. All XOR gates are connected in series to the common sensing line allowing for parallel data read-in. On the other hand, the operation frequency of the graphene transistor can be as high as 427 GHz. The maximum pattern matching throughput defined as $N_{bits}\cdot f_{max}/A_{cell}$ may exceed $10^{22}$ bits/s/cm$^2$, which is several orders of magnitude higher than any currently reported or even projected for scaled circuits. This example illustrates the possibility of building special task analog logic circuits based on graphene devices, which can significantly outperform CMOS in one specific application.

In conclusion, the NDR experimentally observed in G-FETs allows for construction of viable non-Boolean computational architectures. The proposed approach overcomes the absence of the energy bandgap in graphene. The NDR effect appears not only in large scale G-FETs but also in downscaled devices operating in the ballistic transport regime. As such, the present disclosure provides a conceptual change in graphene research proving an alternative route for graphene's applications in information processing.

The experimentally observed NDR effect can be explained in relatively simple terms using the drift-diffusion regime for current conduction in graphene. For example, defining the source-drain $V_{DS}$ and the top-gate voltage $V_{TG}$ to sweep zero simultaneously with a different step size M, gives the following equation.

$$V_{TG}=MV_{DS}=V. \qquad \text{EQ. 1}$$

The NDR effect happen close to the Dirac point where the sheet carrier density $n_s$ is roughly proportional to $V_{TG}$, and may be described by the following equation in which e is the elementary charge and $C_{TG}$ is the capacitance of the top-gate.

$$n_{TG} = C_{TG}(-V_{TG} + V_{TG}^0)/e \qquad \text{EQ. 2}$$

The p-type branch of graphene is chosen for analysis since this is the region where NDR appears. As such, EQ. 2 uses $(-V_{TG} + V_{TG}^0)$, where $V_{TG}^0$ is the top-gate voltage at the Dirac point under a certain back-gate bias.

The current I is described by the following equation, where $\sigma_S = \mu e n_{TG}$ is the conductivity controlled by the gate and $\sigma_0$ is the conductivity at the Dirac point.

$$I = \frac{W}{L}[\sigma_S + \sigma_0]V_{DS} \qquad \text{EQ. 3}$$

This leads to the following equation.

$$I = \frac{W}{L}[\mu C_{TG}(-V_{TG} + V_{TG}^0) + \sigma_0]V_{DS} \qquad \text{EQ. 4}$$
$$= \frac{W}{L}[\mu C_{TG}(-V + V_{TG}^0) + \sigma_0]\frac{V}{M}$$

Taking the derivative of EQ. 4 and setting $$\frac{\partial I}{\partial V} = 0,$$

the peak value of the current achieved is shown below.

$$V_{peak} = \frac{1}{2}\left(\frac{\sigma_0}{\mu C_{TG}} + V_{TG}^0\right). \qquad \text{EQ. 5}$$

The found peak current value is shown below.

$$I_{peak} = \frac{1}{4}\frac{W}{L}\frac{1}{\mu C_{TG}}(\sigma_0 + \mu C_{TG} V_{TG}^0)^2. \qquad \text{EQ. 6}$$

The valley current value, shown below, is reached at $V_{valley} = V_{TG}^0$.

$$I_{valley} = \frac{W}{L}\sigma_0 V_{TG}^0 \qquad \text{EQ. 7}$$

The peak-to-valley ratio is described in the following equation.

$$\frac{I_{peak}}{I_{valley}} = \frac{1}{4}\left[\frac{\sigma_0}{\mu C_{TG} V_{TG}^0} + \frac{\mu C_{TG} V_{TG}^0}{\sigma_0} + 2\right] \qquad \text{EQ. 8}$$

Substituting the common values for the dual-gate graphene devices, $\sigma_0 = 1/6$ k$\Omega$, $\mu = 1000$ cm$^2$/Vs, $C_{TG} = 0.94$ μF/cm$^2$ for ~12 nm AlO$_x$/HfO$_2$ oxide stack and $V_{TG}^0 = -2$V (tunable by back-gate voltage), reveals that the absolute value of $$\frac{\mu C_{TG} V_{TG}^0}{\sigma_0}$$

is much larger than 1, and provides Eq. 9.

$$\frac{I_{peak}}{I_{valley}} \cong \frac{1}{4}\left[\frac{\mu C_{TG} V_{TG}^0}{\sigma_0} + 2\right] \qquad \text{EQ. 9}$$

From EQ. 9, it is clear that the higher mobility μ, larger gate capacitance $C_{TG}$, the Dirac point far from a zero bias, and a lower Dirac conductance $\sigma_0$ will be beneficial for increasing the peak-to-valley ratio $$\frac{I_{peak}}{I_{valley}}$$

of the NDR effect in the graphene devices. The width of the NDR region is determined by the difference between $V_{peak}$ and $V_{valley}$ as shown below.

$$V_{valley} - V_{peak} = \frac{1}{2}\left(V_{tg}^0 - \frac{\sigma_0}{\mu C_{TG}}\right) \qquad \text{EQ. 10}$$

such that the requirement for appearance of the NDR effect is given by the following equation.

$$V_{tg}^0 > \frac{\sigma_0}{\mu C_{TG}} \qquad \text{EQ. 11}$$

Note that the $V_{TG}^0$ for single layer graphene and the $V_{TG}^0$ and $\sigma_0$ for bilayer graphene are tunable by the back-gate voltage $V_{BG}$ and the NDR effect in G-FET is tunable by the back-gate voltage $V_{BG}$.

A representative simulated schematic diagram of an SLG G-FET 24 is shown in FIG. 3A. The SLG G-FET 24 comprises a single layer graphene sheet as a conducting channel. The total channel length between the two leads is taken as 30 nm for both the SLG G-FET 24 and the BLG G-FET 10 (FIG. 1). For the BLG G-FET 10, two single-layer graphene sheets are stacked in AB alignment with an experimental separation distance of 3.35 Å.

The disclosed atomistic model uses a Huckel Hamiltonian with a $p_z$ orbital basis. These atomic orbitals are approximated with Slater Type Orbitals. The matrix elements of the Huckel Hamiltonian (H) are then described by the following equations:

$$H_{i,i} = -V_i \text{ and } H_{i,j} = \frac{c}{2}S_{i,j}(H_{i,i} + H_{j,j}) \ (i \neq j).$$

The diagonal elements of the Hamiltonian are approximated with the $p_z$ orbital ionization energies ($V_i$). The overlap matrix is $S_{i,j} = \langle i|j \rangle$ where $|j\rangle$ is a $p_z$ orbital on atom j. The off-diagonal elements are proportional to the overlap where the constant is taken as c=2.8. The matrix elements of the channel potential (V) are calculated as $\langle i|V|j \rangle = S_{i,j}[V(r_i) + V(r_j)]/2$.

The device Hamiltonian, overlap matrix and the device-to-lead coupling matrices are used in the non-equilibrium Green's Function (NEGF) algorithm to calculate surface self-energies, Green's function, and finally the transport characteristics of G-FETs. Moreover, this disclosure addresses the ballistic transport through the channel. Throughout this disclosure, all calculations are made for room temperature. To incorporate the bias voltage, it is assumed that a constant shift of energy in the channel under the gate region occurs. The potential changes linearly over a distance of 4 nm between the source and channel and between the channel and drain giving an effective channel length of 22 nm.

Those skilled in the art will recognize improvements and modifications to the embodiments of the present disclosure. All such improvements and modifications are considered within the scope of the concepts disclosed herein and the claims that follow.

What is claimed is:

1. A dual-gate transistor having a negative differential resistance (NDR) region comprising:
    a back-gate;
    a zero-bandgap graphene layer disposed on the back-gate;
    a top-gate disposed on a portion of the zero-bandgap graphene layer;
    a source disposed on a portion of the zero-bandgap graphene layer adjacent to the top-gate; and
    a drain disposed on a portion of the zero-bandgap graphene layer adjacent to the top-gate and displaced from the source, wherein the zero-bandgap graphene layer operates in the NDR region when a source-drain voltage and a top-gate voltage are simultaneously swept across a Dirac point.

2. The dual-gate transistor of claim 1 wherein a sweeping range for the top-gate voltage and the source-drain voltage is defined by a top-gate capacitance in a position of the Dirac point.

3. The dual-gate transistor of claim 1 wherein the zero-bandgap graphene layer is made up of pristine graphene.

4. The dual-gate transistor of claim 1 wherein NDR is generated in a drift-diffusion regime at a micrometer scale.

5. The dual-gate transistor of claim 1 wherein NDR is generated in a ballistic regime at a nanometer scale.

6. The dual-gate transistor of claim 5 having dimensions that are around about 10×40 nanometers.

7. The dual-gate transistor of claim 1 wherein the drain and source are diode-connected.

8. The dual-gate transistor of claim 1 wherein the zero-bandgap graphene layer comprises single layer graphene.

9. The dual-gate transistor of claim 1 wherein the zero-bandgap graphene layer comprises bilayer graphene.

10. A graphene-based pattern matching circuit comprising:
    a plurality of elementary cells coupled in series, each elementary cell comprising:
    a first G-FET having a first back-gate that is a first input;
    a second G-FET having a second back-gate that is a second input; and
    a third G-FET having a current output coupled in series with an adjacent one of the plurality of elementary cells and a third back-gate that is coupled to top-gates of the first G-FET and the second G-FET.

11. The graphene-based pattern matching circuit of claim 10 wherein current flowing through the third G-FET decreases with a decrease of a Hamming distance between an input data string coupled to the first input and a reference data string coupled to the second input.

12. The graphene-based pattern matching circuit of claim 10 having an operational frequency range of from around about 100 GHz to around about 500 GHz.

13. The graphene-based pattern matching circuit of claim 10 having a maximum pattern matching throughput of around about 1022 bits/s/cm2.

14. The graphene-based pattern matching circuit of claim 10 wherein each of the plurality of elementary cells provides an exclusive OR (XOR) function.

15. The graphene-based pattern matching circuit of claim 10 wherein each G-FET is a dual-gate transistor having an NDR region comprising:
    a back-gate;
    a zero-bandgap graphene layer disposed on the back-gate;
    a top-gate disposed on a portion of the zero-bandgap graphene layer;
    a source disposed on a portion of the zero-bandgap graphene layer adjacent to the top-gate; and
    a drain disposed on a portion of the zero-bandgap graphene layer adjacent to the top-gate and displaced from the source.

16. The graphene-based pattern matching circuit of claim 15 further including a dynamic bias controller configured to simultaneously sweep a source-drain voltage and a top-gate voltage across a Dirac point to provide operation within the NDR region for each of the first G-FET, the second G-FET and the third G-FET comprising each elementary cell.

17. The graphene-based pattern matching circuit of claim 16 wherein a sweeping range for the top-gate voltage and the source-drain voltage is defined by a top-gate capacitance in a position of the Dirac point.

18. The graphene-based pattern matching circuit of claim 15 wherein the zero-bandgap graphene layer is made up of pristine graphene.

19. The graphene-based pattern matching circuit of claim 15 wherein each G-FET has dimensions that are around about 10×40 nanometers.

20. An apparatus comprising:
    a dual-gate transistor having a negative differential resistance (NDR) region comprising:
    a back-gate;
    a zero-bandgap graphene layer disposed on the back-gate;
    a top-gate disposed on a portion of the zero-bandgap graphene layer;
    a source disposed on a portion of the zero-bandgap graphene layer adjacent to the top-gate; and
    a drain disposed on a portion of the zero-bandgap graphene layer adjacent to the top-gate and displaced from the source; and
    a dynamic bias controller adapted to simultaneously sweep a source-drain voltage and a top-gate voltage across a Dirac point to cause the dual-gate transistor to operate within the NDR region.

* * * * *